United States Patent
Mukai et al.

(10) Patent No.: US 6,534,812 B1
(45) Date of Patent: *Mar. 18, 2003

(54) MEMORY CELL WITH STORED CHARGE ON ITS GATE AND A RESISTANCE ELEMENT HAVING NON-LINEAR RESISTANCE ELEMENTS

(75) Inventors: Mikio Mukai, Kanagawa (JP); Yutaka Hayashi, Ibaraki (JP)

(73) Assignee: Sony Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/487,919

(22) Filed: Jan. 19, 2000

(30) Foreign Application Priority Data

Feb. 4, 1999 (JP) ............................................. 11-027261

(51) Int. Cl.[7] ..................... H01L 27/108; H01L 29/772; H01L 29/94
(52) U.S. Cl. ..................................................... 257/300
(58) Field of Search ........................ 257/300, 314–326; 365/185.05

(56) References Cited

U.S. PATENT DOCUMENTS

| | | | | |
|---|---|---|---|---|
| 3,952,325 A | * | 4/1976 | Beale et al. ............. | 365/185.1 |
| 4,745,079 A | * | 5/1988 | Pfiester ................... | 438/306 |
| 5,514,904 A | * | 5/1996 | Onga et al. .............. | 257/627 |
| 5,581,106 A | | 12/1996 | Hayashi et al. | |
| 5,687,119 A | * | 11/1997 | Park ......................... | 365/185.25 |
| 5,760,438 A | * | 6/1998 | Sethi et al. ............... | 257/317 |
| 5,936,883 A | * | 8/1999 | Kurooka .................. | 365/185.01 |
| 6,104,639 A | | 8/2000 | Hayashi et al. | |

OTHER PUBLICATIONS

Neudeck, "vol. II: The PN Junction Diode", 2nd ed, 1989, Addison–Wesley Publishing Company, pp. 52, 53, 64, 65, 75, 76, 82, and 83.*

* cited by examiner

*Primary Examiner*—Olik Chaudhuri
*Assistant Examiner*—Marcos D. Pizarro-Crespo
(74) *Attorney, Agent, or Firm*—Rader, Fishman & Grauer PLLC; Ronald P. Kananen, Esq.

(57) ABSTRACT

A memory cell with a stored charge on its gate comprising; (A) a channel forming region, (B) a first gate formed on an insulation layer formed on the surface of the channel forming region, the first gate and the channel forming region facing each other through the insulation layer, (C) a second gate capacitively coupled with the first gate, (D) source/drain regions formed in contact with the channel forming region, one source/drain region being spaced from the other, (E) a first non-linear resistance element having two ends, one end being connected to the first gate, and (F) a second non-linear resistance element composed of the first gate, the insulation layer and either the channel-forming region and at least one of the source/drain regions.

26 Claims, 25 Drawing Sheets

EXAMPLE OF V-I CHARACTERISTIC OF 1ST NON-LINEAR RESISTANCE ELEMENT

EXAMPLE OF V-I CHARACTERISTIC OF
1ST NON-LINEAR RESISTANCE ELEMENT

[STEP-100]

[STEP-110]

[STEP-120]

[STEP-510]

[STEP-520]

[STEP-530]

[STEP-600]

[STEP-610]

[STEP-620]

[STEP-800]

[STEP-810]

[STEP-810] CONTINUED

[STEP-820]

[STEP-830]

[STEP-840]

[STEP-850]

MEMORY CELL WITH STORED CHARGE ON ITS GATE AND A RESISTANCE ELEMENT HAVING NON-LINEAR RESISTANCE ELEMENTS

BACKGROUND OF THE INVENTION AND RELATED ART STATEMENT

The present invention relates to a memory cell with a stored charge on its gate, a kind of so-called DRAM gain cell.

A DRAM cell is composed of one transistor and one capacitor which can generally accomplish the minimum area among conventional RAM cells. With a design rule being finer, however, it is requested to develop a complicated capacitor structure and a new capacitor material for achieving a small area and a capacitance which a capacitor is required to have. And, the cost of DRAM production is increasing due to the formation and processing of dielectric materials and electrode films, researches and developments of passivation techniques and introduction of novel manufacturing apparatus, and the cost of the capacitor production is now much more expensive than that of the transistor production. Readout signals lessen as a finer semiconductor device is structured, and it is ultimately difficult to detect information stored in a memory cell without a change in structure and materials.

For overcoming the above problem, one DRAM gain cell is known in "Super-Low-Voltage Operation of a Semi-Static Complementary Gain DRAM Memory Cell", S. Shukuri, et al., 1993 Symposium on VLSI Technology, Digest of Tech. Papers, 3A-4, pp 23–24, 1993. FIG. 28 shows an equivalent circuit of the above DRAM gain cell composed of a memory transistor RM having a floating gate and a complementary word transistor WM. In the DRAM gain cell, a gate of the word transistor WM and a gate of the memory transistor RM are connected to a common word line WL, and one source/drain region of the word transistor WM and one source/drain region of the memory transistor RM are connected to a common bit line BL, so that the number of external wiring is decreased. When information is written in the above DRAM gain cell, a voltage, for example, of 1.5 volts is applied to the bit line BL, and a minus voltage is applied to the word line WL. As a result, a positive charge is stored on the floating gate of the memory transistor RM, and a gate threshold voltage of the memory transistor RM shifts toward a minus direction. When the DRAM gain cell is in a standby state, a potential is applied to the word line WL such that the memory transistor RM and the word transistor WM are not brought into an on-state. When information is read out, applied to the word line WL is a potential between the gate threshold voltage of the memory transistor RM when a positive charge is stored on the floating gate and the gate threshold voltage when no positive charge is stored. As a result, when a positive charge is stored on the floating gate, a current flows through the DRAM gain cell.

As explained above, the DRAM gain cell shown in FIG. 28 in principle requires no capacitor although it is required as an auxiliary in some cases. However, when it is attempted to decrease the area of the DRAM gain cell, the word transistor WM is required to be composed of a thin film transistor (TFT), and the problem is that the production process is complicated and that the DRAM gain cell can be no longer produced by a conventional production process. Further, there is another problem that controllability and reproducibility of TFTs are difficult when mass production technologies available at present are applied. Moreover, there is still another problem that since the above DRAM gain cell has a small operation margin, it is required to connect the gates or the drains of the two transistors to different word lines or different bit lines for securing the operation margin, and that the area of such a DRAM gain cell cannot be decreased.

OBJECT AND SUMMARY OF THE INVENTION

It is therefore an object of the present invention to provide a memory cell with a stored charge on its gate, which does not require much complicated production process, which serves to suppress an increase in the number of external wiring and the area of a terminal portion, which can be produced almost equally by applying a process of producing a conventional flash memory, which does not require complicatedly structured capacitor unlike a conventional DRAMSand which can suppress an increase in a cell area.

The memory cell with a stored charge on its gate, provided by the present invention, for achieving the above object is a memory cell comprising;

(A) a channel-forming region,
(B) a first gate formed on an insulation layer formed on the surface of the channel-forming region, the first gate and the channel-forming region facing each other through the insulation layer,
(C) a second gate capacitively coupled with the first gate,
(D) source/drain regions formed in contact with the channel-forming region, one source/drain region being spaced from the other,
(E) a first non-linear resistance element having two ends, one end being connected to the first gate, and
(F) a second non-linear resistance element composed of the first gate, the insulation layer and either the channel-forming region and at least one of the source/drain regions.

In the above first non-linear resistance element, the "one end connected to the first gate" includes a case where said one end of the first non-linear resistance element has a common region with or serves as the first gate.

In the memory cell with a stored charge on its gate, provided by the present invention (to be simply referred to as "memory cell" hereinafter), the insulation layer has a thickness which permits the flow of tunneling current in the insulation layer when a proper potential is applied between the first gate and the channel forming region or at least one of the source/drain regions which constitutes the second non-linear resistance element. The insulation layer can be formed of $SiO_2$, SiN, SiON, a laminated structure of $SiO_2$/SiN or the like. Of these, $SiO_2$ (silicon oxide layer) having a thickness of 3 nm or less is preferred for forming the insulation layer. The second non-linear resistance element preferably comprises a so-called MIS (Metal-Insulator-Semiconductor) type or MOS (Metal-Oxide-Semiconductor) type tunnel diode which is composed of the first gate, the insulation layer and the channel forming region, of the first gate, the insulation layer and one of the source/drain regions, of the first gate, the insulation layer and both of the source/drain regions; of the first gate, the insulation layer, the channel forming region and one of the source/drain regions or of the first gate, the insulation layer, the channel forming region and both of the source/drain regions.

In the memory cell of the present invention, the first non-linear resistance element preferably has a two-terminal operation characteristic. The term "two-terminal operation characteristic" refers to an operation characteristic that the amount of current which flows between two regions is uniquely determined depending upon a voltage between the two regions as in a diode.

In the memory cell of the present invention, preferably, the first non-linear resistance element has characteristics that it is brought into a low resistive state when a first voltage having the same polarity as that of a forward conduction voltage and having an absolute value which is equal to, or greater than, an absolute value of the forward conduction voltage is applied across the two ends and that it is brought into a high resistive state when a second voltage having the same polarity as that of the forward conduction voltage and having an absolute value smaller than the absolute value of the forward conduction voltage or a voltage having an opposite polarity to the forward conduction voltage is applied across the two ends. For example, when the first non-linear resistance element comprises a diode, it is preferred to use a diode having characteristics that it is brought into a low resistive state when the first voltage equal to, or higher than, the forward conduction voltage is applied.

Specifically, as the first non-linear resistance element having the above characteristics, a pn junction diode can be used. In this case, preferably, the pn junction diode has a semiconductor region which is the same as the source/drain regions in conductivity type and a semiconductor region which is opposite to the source/drain regions in conductivity type, the semiconductor region which is opposite to the source/drain regions in conductivity type corresponds to said one end of the first non-linear resistance element, and the semiconductor region which is the same as the source/drain regions in conductivity type corresponds to said other end of the first non-linear resistance element. The pn-junction diode preferably has a pn junction region formed of a single crystal semiconductor, for achieving a higher resistance value of the first non-linear resistance element in a high resistive state. Otherwise, the pn junction diode preferably has a lateral pn junction in view of the fact that the resistance value of the first non-linear resistance element in a high resistive state can be further increased. Further, the first non-linear resistance lement may comprise a hetero-junction diode from the view point of decreasing (lowering) the forward conduction voltage.

In the memory cell of the present invention, the second gate can be capacitively coupled with the first gate through a dielectric film. The dielectric film can be formed, for example, of $SiO_2$, $SiO_2/Si_xN_y$, $SiO_2/Si_xN_y/SiO_2$ or $Ta_2O_5/Si_xN_y$.

The memory cell of the present invention, may have a configuration in which the second gate is connected to a word line, said other end of the first non-linear resistance element is connected to a bit line, one source/drain region is connected to a read line, and the channel-forming region or at least one of the source/drain regions which constitutes the second non-linear resistance element is connected to an erase line. The above memory cell of the present invention will be called "memory cell according to the first configuration of the present invention". The read line may be formed in parallel with the word line or may be formed in parallel with the bit line. That is, there may be employed a constitution in which a plurality of the memory cells are connected to one word line and one read line or a plurality of the memory cells are connected to one bit line and one read line. Further, there may be employed a constitution in which the memory cells in an arbitrary number, disposed in an arbitrary position, are connected with one read line. Further, preferably, the erase line is connected to a plurality of the memory cells.

In the memory cell according to the first configuration of the present invention, preferably, a first bit-line potential is applied to the bit line, a first read-line potential is applied to the read line and then a word-line potential is switched from a first word-line potential to a second word-line potential, thereby to generate the first voltage between the first gate and said other end of the first non-linear resistance element through the capacitive coupling between the first gate and the second gate and to bring the first non-linear resistance element into a low resistive state, whereby a charge of a first polarity is transported from the bit line to the first gate through the first non-linear resistance element and the charge of the first polarity is stored on or in the first gate. In this manner, information is written in the memory cell.

In the memory cell according to the first configuration of the present invention, preferably, a second bit-line potential is applied to the bit line, a first read-line potential is applied to the read line and then a word-line potential is switched from a first word-line potential to a second word-line potential, thereby to generate the second voltage or a voltage having an opposite polarity to the forward conduction voltage between the first gate and said other end of the first non-linear resistance element through the capacitive coupling between the first gate and the second gate and to keep the first non-linear resistance element in a high resistive state, whereby the charge stored on or in the first gate is prevented from undergoing a change in state. In this manner, writing information in the memory cell can be inhibited.

In the memory cell according to the first configuration of the present invention, preferably, an erase-line potential is applied to the erase line to transport a charge having a second polarity opposite to the first polarity from the erase line to the first gate through the second non-linear resistance element, or to discharge the charge having the first polarity from the first gate to the erase line through the second non-linear resistance element, whereby the charge storage state of the first gate is brought into a second charge storage state. In this manner, information stored in the memory cell can be erased.

In the memory cell according to the first configuration of the present invention, preferably, the first non-linear resistance element comprises a pn junction diode and is formed in the first gate or formed in or on an extended region of the first gate, for the view point of simplifying the constitution. The above pn junction diode can have a semiconductor region which is the same as the source/drain regions in conductivity type and a semiconductor region which is opposite to the source/drain regions in conductivity type, the semiconductor region which is opposite to the source/drain regions in conductivity type corresponds to said one end of the first non-linear resistance element, and the semiconductor region which is the same as the source/drain regions in conductivity type corresponds to said other end of the first non-linear resistance element.

When the first gate or the extended region of the first gate is formed of a polysilicon film, the above pn junction diode may be constituted so as to have a lateral pn junction formed in the polysilicon film. Further, preferably, polysilicon is single-crystallized, and at least the pn junction region is formed in a single-crystallized portion, i.e., the pn junction region of the pn junction diode is formed of a single crystal semiconductor, in view of the fact that the resistance value of the first non-linear resistance element in a high resistive state can be further increased.

Alternatively, in the memory cell according to the first configuration of the present invention, preferably, the first non-linear resistance element comprises a hetero-junction diode and is formed on the first gate or on an extended region of the first gate, from the view point of decreasing (lowering) the forward conduction voltage.

The memory cell, provided by the present invention preferably, may have a configuration in which the second gate is connected to a word line, said other end of the first non-linear resistance element and one source/drain region are connected to a bit line, and the channel-forming region or at least one of the source/drain regions which constitutes the second non-linear resistance element is connected to an erase line. The above memory cell of the present invention will be called "memory cell according to the second configuration of the present invention".

In the memory cell according to the second configuration of the present invention, preferably, a first bit-line potential is applied to the bit line and then a word-line potential is switched from a first word-line potential to a second word-line potential, thereby to generate the first voltage between the first gate and said other end of the first non-linear resistance element through the capacitive coupling between the first gate and the second gate and to bring the first non-linear resistance element into a low resistive state, whereby a charge of a first polarity is transported from the bit line to the first gate through the first non-linear resistance element and the charge of the first polarity is stored on or in the first gate. In this manner, information can be written in the memory cell.

In the memory cell according to the second configuration of the present invention, preferably, a second bit-line potential is applied to the bit line and then a word-line potential is switched from a first word-line potential to a second word-line potential, thereby to generate the second voltage or a voltage having an opposite polarity to the forward conduction voltage, between the first gate and said other end of the first non-linear resistance element through the capacitive coupling between the first gate and the second gate and to keep the first non-linear resistance element in a high resistive state, whereby the charge stored on or in the first gate is prevented from undergoing a change in state. In this manner, writing information in the memory cell can be inhibited.

In the memory cell according to the second configuration of the present invention, preferably, similarly, an erase-line potential is applied to the erase line to transport a charge having a second polarity opposite to the first polarity from the erase line to the first gate through the second non-linear resistance element, or to discharge the charge having the first polarity from the first gate to the erase line through the second non-linear resistance element, whereby the charge storage state of the first gate is brought into a second charge storage state. In this manner, information stored in the memory cell can be erased.

In the memory cell according to the second configuration of the present invention, preferably, the first non-linear resistance element comprises a pn junction diode and is formed in the first gate or formed in or on an extended region of the first gate, from the view point of simplifying the constitution. Preferably, the above pn junction diode has a semiconductor region which is the same as the source/drain regions in conductivity type and a semiconductor region which is opposite to the source/drain regions in conductivity type, the semiconductor region which is opposite to the source/drain regions in conductivity type corresponds to said one end of the first non-linear resistance element, and the semiconductor region which is the same as the source/drain regions in conductivity type corresponds to said other end of the first non-linear resistance element.

When the first gate or the extended region of the first gate is formed of a polysilicon film, the above pn junction diode may be constituted so as to have a lateral pn junction formed in the polysilicon film. Further, preferably, polysilicon is single-crystallized, and at least the pn junction region is formed in a single-crystallized portion, i.e., the pn junction region of the pn junction diode is formed of a single crystal semiconductor, in view of the fact that the resistance value of the first non-linear resistance element in a high resistive state can be further increased. Otherwise, preferably, the first non-linear resistance element comprises a hetero-junction diode and is formed on the first gate or on an extended region of the first gate, from the view point of decreasing (lowering) the forward conduction voltage.

The memory cell, provided by the present invention, preferably has a configuration in which the second gate is connected to a word line, said other end of the first non-linear resistance element is connected to one source/drain region, said one source/drain region is connected to a bit line, and the channel forming region or at least one of the source/drain regions which constitutes the second non-linear resistance element is connected to an erase line. The above memory cell will be called "memory cell according to the third configuration of the present invention". The above expression "the other end of the first non-linear resistance element is connected to one source/drain region" includes a case where said other end of the first non-linear resistance element has a common region with or serves as said one source/drain region. When the second non-linear resistance element comprises at least one of the source/drain regions, said one of the source/drain regions is to be different from one source/drain region to which said other end of the first non-linear resistance element is connected.

In the memory cell according to the third configuration of the present invention, preferably, a first bit-line potential is applied to the bit line and then a word-line potential is switched from a first word-line potential to a second word-line potential, thereby to generate the first voltage between the first gate and said one source/drain region through the capacitive coupling between the first gate and the second gate and to bring the first non-linear resistance element into a low resistive state, whereby a charge of a first polarity is transported from the bit line to the first gate through said one source/drain region and the first non-linear resistance element, and the charge of the first polarity is stored on or in the first gate. In this manner, information can be written in the memory cell.

In the memory cell according to the third configuration of the present invention, preferably, a second bit-line potential is applied to the bit line and then a word-line potential is switched from a first word-line potential to a second word-line potential, thereby to generate the second voltage or a voltage having an opposite polarity to the forward conduction voltage, between the first gate and said one source/drain region through the capacitive coupling between the first gate and the second gate and to keep the first non-linear resistance element in a high resistive state, whereby the charge stored on or in the first gate is prevented from undergoing a change in state. In this manner, writing information in the memory cell can be inhibited.

In the memory cell according to the third configuration of the present invention as well, preferably, an erase-line potential is applied to the erase line to transport a charge having a second polarity opposite to the first polarity from the erase line to the first gate through the second non-linear resistance element, or to discharge the charge having the first polarity from the first gate to the erase line through the second non-linear resistance element, whereby the charge storage state of the first gate is brought into a second charge storage state. In this manner, information stored in the memory cell can be erased.

The memory cell according to the third configuration of the present invention may have a configuration in which the first non-linear resistance element comprises a pn junction diode, one region of the pn junction diode (a region of the pn junction diode which is opposite to the source/drain regions in conductivity type) corresponding to said one end of the first non-linear resistance element is formed in said one source/drain region, and the other region of the pn junction diode (a region of the pn junction diode which is the same as the source/drain regions in conductivity type) corresponding to said other end of the first non-linear resistance element has a common region with or serves as said one source/drain region. Otherwise, it may have a configuration in which the first non-linear resistance element preferably comprises a pn junction diode, one region of the pn junction diode (a region of the pn junction diode which is opposite to the source/drain regions in conductivity type) corresponding to said one end of the first non-linear resistance element has a common region with or serves as the first gate, and the other region of the pn junction diode (a region of the pn junction diode which is the same as the source/drain regions in conductivity type) corresponding to said other end of the first non-linear resistance element is formed in an extended region of the first gate extending to said one source/drain region. When the first gate or the extended region of the first gate is formed of a polysilicon, the above pn junction diode may be constituted so as to have a lateral pn junction formed in the polysilicon film. Further, preferably, polysilicon is single-crystallized, and at least the pn junction region is formed in a single-crystallized portion, i.e., the first non-linear resistance element comprises a pn junction diode and the pn junction region of the pn junction diode is formed of a single crystal semiconductor, in view of the fact that the resistance value of the first non-linear resistance element in a high resistive state can be further increased. Otherwise, preferably, the pn junction diode constituting the first non-linear resistance element has a lateral pn junction, in view of the fact that the resistance value of the first non-linear resistance element in a high resistive state can be further increased. Otherwise, preferably, the first non-linear resistance element comprises a hetero-junction diode from the view point of decreasing (lowering) the forward conduction voltage.

In the memory cells according to the first, second or third configuration of the present invention, preferably, the other source/drain region is reversely biased with regard to the channel forming region when the second word-line potential is applied to the word line. Specifically, when the memory cell is n type, a potential greater than a value obtained by deducting a gate threshold voltage (seen from the first gate) from a potential of the first gate can be applied to said other source/drain region, and when the memory cell is p type, a potential smaller than a value obtained by deducting a gate threshold voltage (seen from the first gate) from a potential of the first gate can be applied to said other source/drain region. Alternatively, preferably, the other source/drain region is brought into a floating state with regard to the channel forming region when the second word-line potential is applied to the word line. Specifically, for example, a transistor for selection connected to said other source/drain region can be turned off. In the above manner, the current which flows between the source/drain regions of the memory cell can be reliably inhibited when information is written, i.e., when a charge is stored on or in the first gate, and the power consumption of the memory cell can be decreased.

In the memory cells according to the first, second or third configuration of the present invention, there may be employed an embodiment in which the charge to be stored on or in the first gate can correspond to stored information and the stored information is information corresponding to a level number of the first bit-line potential. In this case, there may be employed an embodiment in which the level number of the first bit-line potential to be applied to the bit line is one and the stored information is binary information, and there may be also employed another embodiment in which the level number of the first bit-line potential to be applied to the bit line is at least two and the stored information is multi-valued information.

Otherwise, there may be employed an embodiment in which the charge to be stored on or in the first gate corresponds to stored information and the stored information is information corresponding to a level number of the second word-line potential. In this case, there may be employed an embodiment in which the level number of the second word-line potential to be applied to the word line is one and the stored information is binary information, and there may be also employed another embodiment in which the level number of the second word-line potential to be applied to the word line is at least two and the stored information is multi-valued information.

Further, there may be employed an embodiment in which the charge to be stored on or in the first gate corresponds to stored information and the stored information is information corresponding to a level number of the voltage between the second word-line potential and the first bit-line potential. In this case, there may be employed an embodiment in which the level number of the voltage between the second word-line potential and the first bit-line potential is one and the stored information is binary information, and there may be also employed another embodiment in which the level number of the voltage between the second word-line potential and the first bit-line potential is at least two and the stored information is multi-valued information.

For example, when the first bit-line potential applied to the bit line has a level number of two, or when the second word-line potential applied to the word line has a level number of two, or further, when the voltage between the second word-line potential and the first bit-line potential has a level number of two, stored information is ternary information. For example, when the first bit-line potential applied to the bit line has a level number of three, or when the second word-line potential applied to the word line has a level number of three, or further, when the voltage between the second word-line potential and the first bit-line potential has a level number of three, stored information is 4-valued information. Generally, when the first bit-line potential applied to the bit line has a level number of M, or when the second word-line potential applied to the word line has a level number of M, or further, when the voltage between the second word-line potential and the first bit-line potential has a level number of M, stored information is (M+1)-valued information.

BRIEF DESCRIPTION OF THE DRAWINGS

The present invention will be explained in detail with reference to drawings.

FIGS. 10A and 10B, are schematic, partial cross-sectional views of a semiconductor substrate, etc., for explaining the process for the manufacture of the memory cell in Example 1.

FIG. 23C, are schematic, partial cross-sectional views of the semiconductor substrate, etc., for explaining the process for the manufacture of the memory cell in Example 8.

FIG. 24B, are schematic, partial cross-sectional views of the semiconductor substrate, etc., for explaining the process for the manufacture of the memory cell in Example 8.

FIG. 25B, is a schematic, partial cross-sectional view of the semiconductor substrate, etc., for explaining the process for the manufacture of the memory cell in Example 8.

DESCRIPTION OF THE PREFERRED EMBODIMENT(S)

Embodiments (Examples) of the present invention will be explained with reference to drawings hereinafter. In drawings, "WL" stands for a word line, "BL" stands for a bit line, "RL" stands for a read line, "EL" stands for an erase line, and "1st ELEMENT" stands for a first non-linear resistance element.

[Explanation of the Operational Principle of the Memory Cell According to the First Configuration of the Present Invention (No. 1)]

Figure 1A:
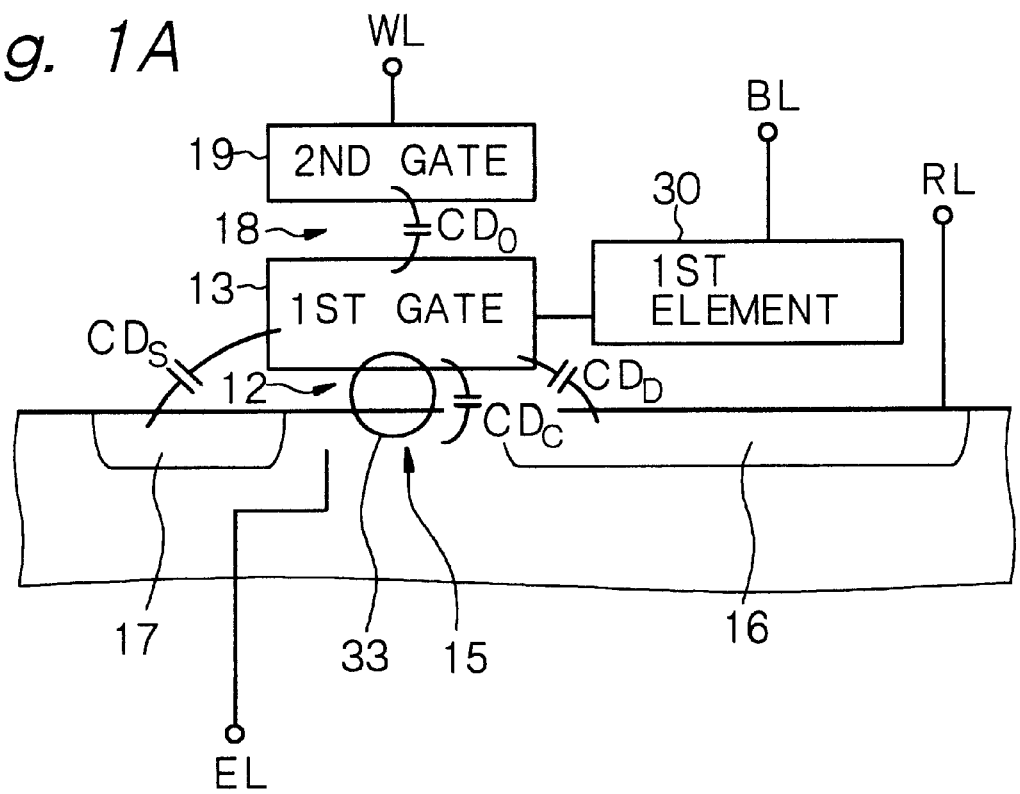
FIG. 1A shows a fundamental, principle drawing.
Figure 1B:
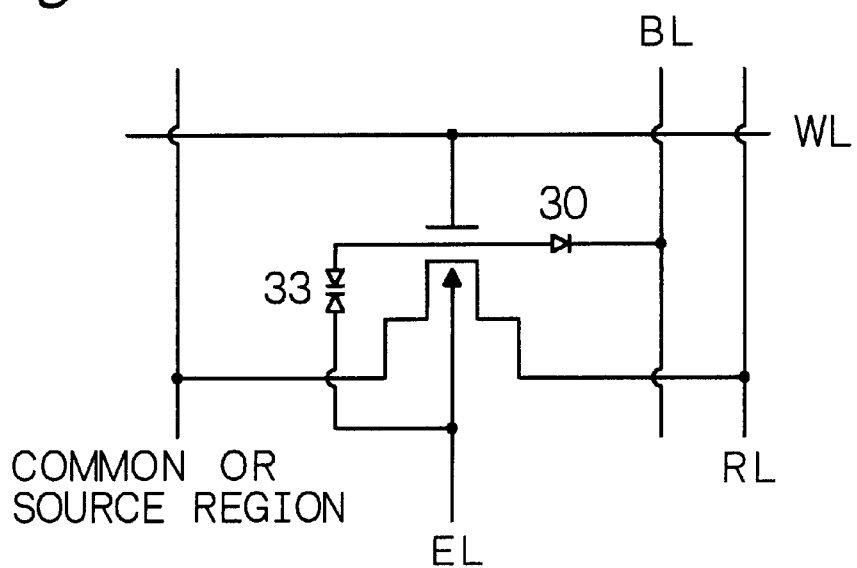
FIG. 1B shows an equivalent circuit of the memory cell according to the first configuration of the present invention.
Figure 2:
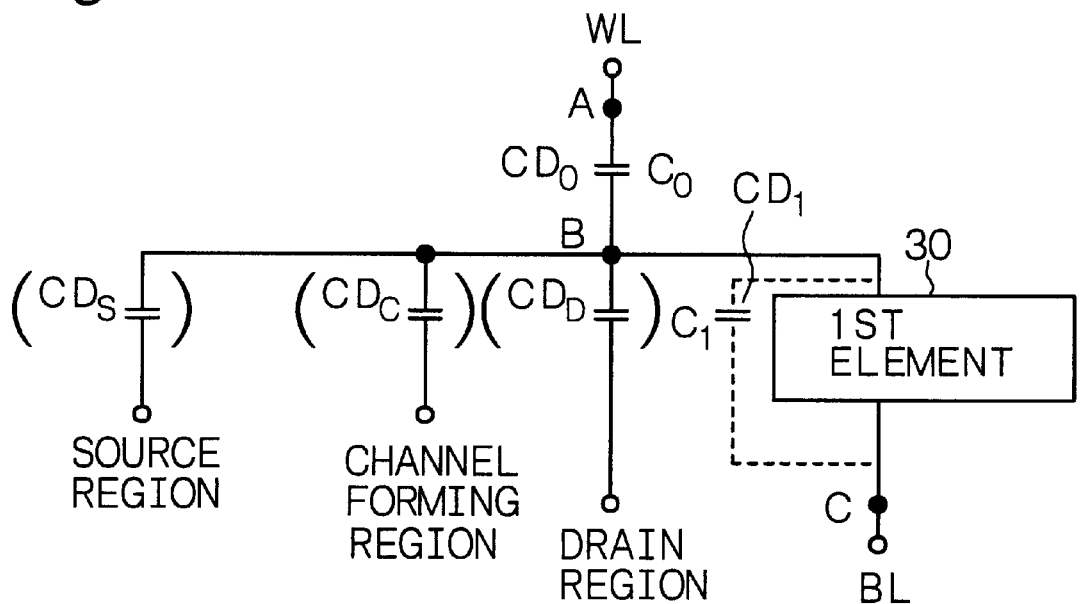
FIG. 2 shows an equivalent circuit of the memory cell according to the first configuration of the present invention.

The operational principle of the memory cell according to the first configuration of the present invention will be explained first below. FIG. 1A shows a fundamental, principle drawing of the memory cell according to the first configuration of the present invention, and FIG. 1B and FIG. 2 show its equivalent circuits. The following description explains the operational principle of an n-type memory cell as an example, while a p-type memory cell also similarly operates except that changes in a potential, etc., are reversed.

The memory cell according to the first configuration of the present invention comprises a channel forming region 15, an insulation layer 12 formed on the surface of the channel forming region 15, a first gate 13 formed on the insulation layer 12, a second gate 19 capacitively coupled with the first gate 13, source/drain regions 16 and 17 (drain region 16 and source region 17) formed in contact with the channel forming region 15 and spaced from each other, a first non-linear resistance element 30 having two ends, and a second non-linear resistance element 33. The first gate 13 and the channel forming region 15 face each other through the insulation layer 12. One end of the first non-linear resistance element 30 is connected to the first gate 13, and the other end is connected to a bit line BL. Further, the second non-linear resistance element 33 comprises the first gate 13, the insulation layer 12 and, for example, the channel forming region 15. Furthermore, the second gate 19 is connected to a word line WL, and one source/drain region (the drain region 16) is connected to a read line RL. The second gate 19 is capacitively coupled with the first gate 13 through a dielectric film 18. The first gate 13 is a kind of a floating gate.

In FIG. 1A and FIG. 2, symbol $C_1$ stands for a capacitance of a parasitic capacitance $CD_1$ of the first non-linear resistance element 30. Symbol $C_0$ stands for a capacitance of a capacitor $CD_0$ composed of the first gate 13, the dielectric film 18 and the second gate 19. Further, symbol $CD_D$ stands for a capacitor composed of one source/drain region 16, the insulation layer 12 and the first gate 13. Symbol $CD_C$ stands for a capacitor composed of the first gate 13, the insulation layer 12 and the channel forming region 15, and symbol $CD_S$ stands for a capacitor composed of the first gate 13, the insulation layer 12 and the other source/drain region 17. The capacitance $C_D$ of the capacitor $CD_D$, the capacitance $C_C$ of the capacitor $CD_C$, the capacitance Cs of the capacitor $CD_S$, the capacitance $C_0$ of the capacitor $CD_0$ and the capacitance $C_1$ of the parasitic capacitor $CD_1$ of the first non-linear resistance element 30 diversely change depending upon the structure and size of the memory cell. On the assumption that the capacitance $C_D$ of the capacitor $CD_D$, the capacitance $C_C$ of the capacitor $CD_C$ and the capacitance $C_S$ of the capacitor $CD_S$ are negligibly small, the operational principle of the memory cell will be explained below while only taking into consideration the capacitance $C_0$ of the capacitor $CD_0$ and the capacitance $C_1$ of the parasitic capacitor $CD_1$ of the first non-linear resistance element 30.

Figure 3:
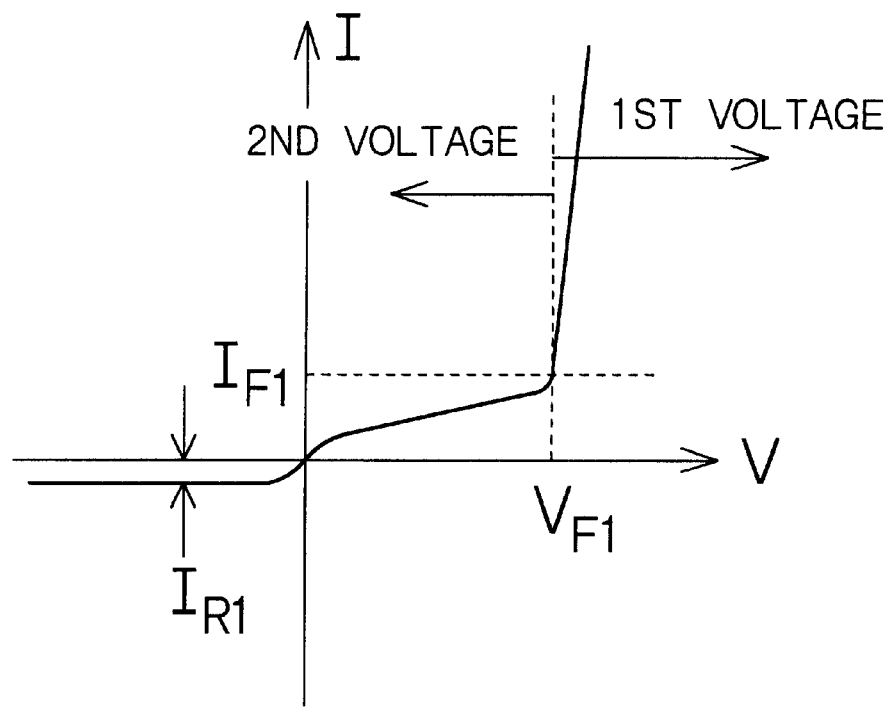
FIG. 3 is a graph showing one example of V-I characteristic of a first non-linear resistance element.

FIG. 3 schematically shows the V-I characteristic of the first non-linear resistance element 30. The first non-linear resistance element 30 has a forward direction characteristic that it has a voltage $V_{F1}$ (forward conduction voltage) at a current value of $I_{F1}$. That is, the first non-linear resistance element 30 has a two-terminal operation characteristic.

Further, the first non-linear resistance element 30 has the following characteristics. When a first voltage which has the same polarity as that of the forward conductive voltage ($V_{F1}$) and has an absolute value equal to, or greater than, the absolute value of the forward conduction voltage ($V_{F1}$) is applied across the two ends, it is brought into a low resistive state, and current which flows through the first non-linear resistance element 30 sharply increases. When a second voltage which has the same polarity as that of the forward conductive voltage ($V_{F1}$) and has an absolute value smaller than the absolute value of the forward conduction voltage ($V_{F1}$) or which has an opposite polarity to the forward conduction voltage is applied across the two ends, it is brought into a high resistive state. For example, when the first non-linear resistance element 30 comprises a pn junction diode, a current increases by a factor of e at a voltage increase of kT/q, in which k is a Boltzmann constant, T is an absolute temperature, q is an electron charge, and e is an exponent.

In the memory cell according to the first configuration of the present invention, the charge stored on or in the first gate 13 corresponds to stored information. Initial conditions of the memory cell are assumed, for example, to be as shown in the following Table 1. In Table 1, γ is a proportional constant determined on the basis of the capacitance ratio.

TABLE 1

| | |
|---|---|
| Potential of second gate (first word-line potential) | : $V_{WL1}$ |
| Potential of first gate | : $\gamma V_{WL1}$ |
| Potential of bit line | : $V_{BL0}$ |
| Potential of read line (first bit-line potential) | : $V_{RL1}$ |
| Potential of source region | : $V_S$ |

Specifically, the values of $V_{WL1}$, $\gamma V_{WL1}$, $V_{BL0}$, $V_{RL1}$ and $V_S$ can be set at values close to 0 volt.

[Writing of Information]

When information is written in the memory cell, that is, when a negative charge $Q_F$ of a first polarity is stored on or in the first gate 13, a first bit-line potential $V_{BL1}$ is applied to the bit line BL, the first read-line potential $V_{RL1}$ is kept on as a potential of the read line, and then a word-line potential is switched from the first word-line potential $V_{WL1}$ to a second word-line potential $V_{WL2}(>>V_{F1})$. The first bit-line potential $V_{BL1}$ may equal $V_{BL0}$. That is, the potential applied to the bit line BL may not be changed. When potentials in sites A, B and C in FIG. 2 are $V_A$, $V_B$ and $V_C$ in this case, $V_A$, $V_B$ and $V_C$ are as follows. In addition, in the writing procedure, first, the bit-line potential is switched from $V_{BL0}$ (for example, 0 volt) to the first bit-line potential $V_{BL1}$ or a second bit-line potential $V_{BL2}$ to be described later, then, the word-line potential is switched from the first word-line potential $V_{WL1}$ to the second word-line potential $V_{WL2}$, then, the word-line potential is switched from the second word-line potential $V_{WL2}$ back to the first word-line potential $V_{WL1}$, and then the bit-line potential is switched from the first bit-line potential $V_{BL1}$ or the second bit-line potential $V_{BL2}$ back to $V_{BL0}$.

$$V_A = V_{WL2} \quad (1\text{-}1)$$

$$V_B = \{C_0/(C_1+C_0)\}(V_{WL2}-V_{BL1})+V_{BL1} \quad (1\text{-}2)$$

$$V_C = V_{BL1} \quad (1\text{-}3)$$

The express (1-2) shows a calculation on the assumption that the first non-linear resistance element 30 is in a high resistive state. When the value of $(V_B-V_{BL1})$ becomes greater than $V_{F1}$, the first non-linear resistance element 30 is brought into a low resistive stage. In other words, the first non-linear resistance element 30 is brought into a low resistive state by selecting $V_{WL2}$ and $V_{BL1}$ such that the following expression (2) is satisfied, i.e., generating the first voltage between the first gate 13 and the other end of the first non-linear resistance element 30. As a result, the first gate 13 is brought from a nearly floating state where it is electrically connected to the bit line BL at an initial high resistance to a state where it is electrically connected to the bit line BL at a low resistance.

$$|\{C_0/(C_1+C_0)\}(V_{WL2}-V_{BL1})|>|V_{F1}| \quad (2)$$

As a result, the potential difference $V_{AB}$ between the sites A and B when seen from the site B (i.e., from the first gate 13) is as shown in the following expression (3).

$$V_{AB} \approx V_{WL2} - V_{F1} - V_{BL1} \quad (3)$$

Then, the potential of the second gate 19 is switched from the second word-line potential $V_{WL2}$ to the first word-line potential $V_{WL1}$ and then the potential of the bit line BL is switched to $V_{BL0}$. As a result, the first non-linear resistance element 30 is brought into a high resistive state. And, the first gate 13 is again brought into a nearly floating state, and the negative charge $Q_F$ of a first polarity is freshly stored on or in the first gate 13. The above negative charge ($Q_F$) stored on or in the first gate 13 corresponds to information stored in the memory cell.

As shown in the above expression (3), the potential difference $V_{AB}$ between the sites A and B depends upon a voltage between the second word-line potential $V_{WL2}$ and the first bit-line potential $V_{BL1}$. When the capacitance of each of the capacitors $CD_S$, $CD_C$ and $CD_D$ is not negligible, the potential difference $V_{AB}$ between the sites A and B depends upon the potential of each of the source region, the channel forming region and the drain region, which is not further discussed for simplification of an explanation. For example, (1-1) if the voltage between the second word-line potential $V_{WL2}$ and the first bit-line potential $V_{BL1}$ has a level number of one, (2-1) if the first bit-line potential $V_{BL1}$ has a level number one when the second word-line potential $V_{WL2}$ is constant, or (3-1) if the second word-line potential $V_{WL2}$ has a level number of one when the first bit-line potential $V_{BL1}$ is constant, the charge corresponding to information stored on or in the first gate 13 is binary information ("0" or "1"). Otherwise, the charge stored on or in the first gate 13 depends upon a voltage between the second word-line potential $V_{WL2}$ and the first bit-line potential $V_{BL1}$. Therefore, (1-2) by designing the voltage between the second word-line potential $V_{WL2}$ and the first bit-line potential $V_{BL1}$ to have a level number of two or more, (2-2) by designing the first bit-line potential $V_{BL1}$ to have a level number of two or more (for example, $V_{BL1}$, $V_{BL1\_1}$, $V_{BL1\_2}$, ... $V_{BL2}$, in which $V_{BL1}$ is a minimum value and $V_{BL2}$ is a maximum value) when the second word-line potential $V_{WL2}$ is constant or (3-2) by designing the second word-line potential $V_{WL2}$ to have a level number of two or more when the first bit-line potential $V_{BL1}$ is constant, the charge to be stored on or in the first gate 13 can be a negative charge, $Q_F$, $Q_{F\_1}$, $Q_{F\_2}$, ... That is, information stored on or in the first gate 13 can be (1-3) multi-valued information corresponding to the level number of the voltage between the second word-line potential $V_{WL2}$ and the first bit-line potential $V_{BL1}$, (2-3) multi-valued information corresponding to the level number of the first bit-line potential applied to the bit line or (3-3) multi-valued information corresponding to the level number of the second word-line potential applied to the word line. As a result, values obtained by converting the above negative charges $Q_F$, $Q_{F\_1}$, $Q_{F\_2}$, ... to potentials of the first gate 13 are $V_{INF}$, $V_{INF\_1}$, $V_{INF\_2}$, ...

On the other hand, when it is not necessary to write information in the memory cell while writing information in other memory cells, first, a second bit-line potential $V_{BL2}$ is applied to the bit line BL, and then the word-line potential is switched from the first word-line potential $V_{WL1}$ to the second word-line potential $V_{WL2}$ ($>>V_{F1}$). When potentials in sites A, B and C in FIG. 2 are $V_A$, $V_B$ and $V_C$ in this case, $V_A$, $V_B$ and $V_C$ are as follows.

$$V_A = V_{WL2} \quad (4\text{-}1)$$

$$V_B = \{C_0/(C_1+C_0)\}(V_{WL2}-V_{BL2})+V_{BL2} \quad (4\text{-}2)$$

$$V_C = V_{BL2} \quad (4\text{-}3)$$

When the value of $(V_B-V_C)[=\{C_0/(C_1+C_0)\}(V_{WL2}-V_{BL2})]$ of the expression (4-2) is less than $V_{F1}$, the first non-linear resistance element 30 is kept in a high resistive state. In other words, when a voltage (second voltage) having the same polarity as that of the forward conduction voltage ($V_{F1}$) and having an absolute value smaller than the absolute value of the forward conduction voltage $V_{F1}$ or a voltage having an opposite polarity to the forward conduction voltage ($V_{F1}$) is generated between the first gate 13 and the other end of the first non-linear resistance element 30, i.e., when $V_{BL2}$ is selected so as to satisfy the following expression (5), the first non-linear resistance element 30 is kept in a high resistive state.

$$\{C_0/(C_1+C_0)\}(V_{WL2}-V_{BL2}) < V_{F1} \quad (5)$$

As a result, the first gate 13 is kept nearly in a floating state, and if the potential difference between two ends of the parasitic capacitor $CD_1$ of the first non-linear resistance element 30 and the potential difference between two ends of the capacitor $CD_0$ are $V_1$ and $V_2$, respectively, $V_1$ and $V_2$ are as follows.

$$V_1 = \{C_0/(C_1+C_0)\}(V_{WL2}-V_{BL2}) \quad (6\text{-}1)$$

$$V_2 = \{C_1/(C_1+C_0)\}(V_{WL2}-V_{BL2}) \quad (6\text{-}2)$$

Then, the potential of the second gate 19 is switched from the second word-line potential $V_{WL2}$ to the first word-line potential $V_{WL1}$, and then the potential of the bit line BL is switched to $V_{BL0}$. As a result, an temporary charge induced on each of the capacitor $CD_0$ and the first non-linear resistance element 30 is discharged, and no charge is stored on or in the first gate 13. In other words, charging and discharging which occur through the first non-linear resistance element 30 are negligibly small, and therefore, the first gate 13 is brought back to an initial state. That is, no information is substantially written in the memory cell.

For reliably preventing the flow of current between the source/drain regions 16 and 17 of the memory cell when information is written, the other source/drain region (the source region 17) is preferably reversely biased with regard to the channel forming region 15. Specifically, a potential greater than a value obtained by deducting a gate threshold voltage (seen from the first gate 13) from the potential of the first gate 13 can be applied to the other source/drain region (the source region 17). Otherwise, the other source/drain region (the source region 17) is preferably brought into a floating state with regard to the channel forming region 15. Specifically, for example, a transistor for selection connected to the other source/drain region (the source region 17) can be turned off.

In a standby state, the potential of the word line WL is kept at a potential at which the memory cell is not brought into an on-state (state in which a current flows between the source/drain regions 16 and 17). Specifically, the word line WL is kept at a potential equal to, or lower than, $V_{th\_L}$ to be described later. On the other hand, there is another case where other memory cell connected to the bit line BL is under operation. It is therefore required to be secured that the current flowing through the first non-linear resistance element 30 of the memory is $I_{R1}$ even when the bit line BL has a potential of $V_{BL2}$ and a potential equivalent to the charge stored on or in the first gate 13 of the memory cell is $V_{INF}$. Therefore, the potential of the word line WL in a standby state is required not to be lower than the value expressed by the following expression. $V_{INF}$ is a potential when the word line WL has a potential of 0 volt.

$$\{(C_1+C_0)/C_0\} \times |V_{INF}|$$

[Readout of Information]

For a time period shorter than $Q_F/I_{R1}$, information stored on or in the first gate 13 can be read out. For example, when $C_0 = 1 \times 10^{-15}$ F and $I_{R1} = 1 \times 10^{-15}$ amperes, information can be read out for about 1 second.

The gate threshold voltage in the memory cell changes depending upon whether or not a charge is stored on or in the first gate 13. That is, when information is stored in the memory cell, in other words, when the negative charge $Q_F$ is stored on or in the first gate 13, the gate threshold voltage of the memory cell shifts toward a plus side. The above gate threshold voltage is taken as $V_{th\_H}$. On the other hand, when no information is stored in the memory cell, or in other words, when no charge is stored on or in the first gate 13 (positive charge may be stored in some cases), the gate threshold voltage of the memory cell has no change (or may be shifted toward a minus side in some cases). The above gate threshold voltage is taken as $V_{th\_L}$. When information stored in the memory cell is read out, the potentials of the word line, the bit line and the read line are set, for example, as shown in Table 2.

TABLE 2

| | |
|---|---|
| Potential of second gate (word-line potential) | : $V_{WL-R}$ |
| Potential of bit line | : $V_{BL-R}$ |
| Potential of read line (second read-line potential) | : $V_{RL-R}$ |
| Potential of source region | : $V_S$ |

However, the potential of the second gate word-line potential), $V_{WL-R}$, is to satisfy $V_{th\_L} < V_{WL-R} < V_{th\_H}$. The second read-line potential which is a potential of the read line RL is to have a value from 0.5 volt to a power source potential $V_{dd}$. Further, the potential, $V_{BL-R}$, of the bit line can be a value which satisfies $V_{BL0} < V_{BL-R} < V_{BL2}$.

As a result, the first non-linear resistance element 30 is kept in a high resistive state. Further, when information is stored in the memory cell, the memory cell is kept in an off-state. On the other hand, when no memory is stored in the memory cell, the memory cell is in an on-state. By detecting whether or not a current flows through the source/drain regions 16 and 17 of the memory cell, therefore, it can be determined whether or not information is stored in the memory cell.

When multi-valued information is stored on or in the first gate 13, i.e., when one of negative charge $Q_F$, $Q_{F1}$, $Q_{F2}$, ... is stored on or in the first gate 13, the gate threshold voltage of the memory cell shifts toward a plus side. For the convenience of an explanation, $|Q_F| > |Q_{F1}| > |Q_{F2}|$ ... and the gate threshold voltage is assumed to be $V_{th\_H}$, $V_{th\_1}$, $V_{th\_2}$, ... When information stored in the memory cell is read out, first, a potential between $V_{th\_(N-1)}$ and $V_{th\_N}$ is applied to the word line WL. When N=1, a potential between $V_{th\_H}$ and $V_{th\_L}$ is applied to the word line. The above "N" is an N-th level of the multi-valued information and stands for the highest level. As a result, when information having the N-th level is stored in the memory cell, the memory cell is kept in an off-state. On the other hand, when no information is stored in the memory cell, or when information having a level equal to, or below, the (N−1l)-th level is stored in the memory cell, the memory cell is in an on-state. By detecting whether or not a current flows through the source/drain regions 16 and 17 of the memory cell, therefore, it can be determined whether or not information having an N-th level is stored in the memory cell.

[Erasing of Information]

In the memory cell in which the information is stored, i.e., in which the negative charge $Q_F$ is stored on or in the first gate 13, the information can be erased by simply applying 0 volt to the source/drain regions 16 and 17 and the channel forming region 15 and applying a minus potential to the word line WL, or by applying to the first gate 13 a negative potential sufficiently negative with regard to the source/drain regions 16 and 17 or the channel forming region 15 to bring the memory cell into a state where a tunneling current flows through the insulation layer 12. The erasing of information is simultaneously effected on all of the memory cells connected to one word line, on all of the memory cells, or on all of the memory cells formed in one well.

In another embodiment, the above erasing of information can be also effected by applying 0 volt or a minus potential to the word line WL, bringing the bit line BL, the read line RL and either the common or source line into a floating state and applying a predetermined potential (for example, some plus volts) which is an erase-line potential to the erase line EL (more specifically, the channel forming region formed in the memory cell). As a result, a certain potential difference is generated between the channel forming region and the first gate, and a tunneling current flows from the channel forming region 15 to the first gate 13 through the insulation layer 12, so that the charge of the second polarity opposite to the first polarity can be transported from the erase line to the first gate 13 through the second non-linear resistance element 33, or that the charge having the first polarity can be discharged to the erase line from the first gate 13 through the second non-linear resistance element 33. Namely, the charge storage state of the first gate 13 can be brought into a second charge storage state, i.e., an erased state. The erasing of information is simultaneously effected on all of the memory cells connected to one word line, on all of the memory cells, or on all of the memory cells formed in one well. The "erasing" is used in this sense hereinafter.

The erase-line potential may be applied to the erase line EL (specifically, common or source line), in a state where 0 volt or a minus potential is applied to the word line WL and the bit line BL, the read line RL and the channel forming region are brought into a floating state. In this case, the second non-linear resistance element comprises the first gate, the insulation layer and one source/drain region (specifically, source region).

In another embodiment, an erase-line potential may be applied to the erase line EL (more specifically, read line EL), in a state where 0 volt or a minus potential is applied to the word line BL and the bit line BL, the common or source line and the channel forming region are brought into a floating state. In this case, the second non-linear resistance element comprises the first gate, the insulation layer and one source/drain region (specifically, source region).

In another embodiment, further, an erase-line potential may be applied to the erase line EL (more specifically, the common or source line and the channel forming region), in a state where 0 volt or a minus potential is applied to the word line BL and the bit line BL and the read line RL are brought into a floating state. In this case, the second non-linear resistance element comprises the first gate, the insulation layer, one source/drain region (specifically, source region) and the channel forming region.

In another embodiment, further, an erase-line potential may be applied to the erase line EL (more specifically, the read line EL and the channel forming region), in a state where 0 volt or a minus potential is applied to the word line BL and the bit line BL and the common or source line are brought into a floating state. In this case, the second non-linear resistance element comprises the first gate, the insulation layer, one source/drain region (specifically, drain region) and the channel forming region.

In another embodiment, further, an erase-line potential may be applied to the erase line EL (more specifically, the read line EL and the common or source line), in a state where 0 volt or a minus potential is applied to the word line BL and the bit line BL and the entire channel forming region are brought into a floating state. In this case, the second non-linear resistance element comprises the first gate, the insulation layer and both of the source/drain regions.

In the memory cell according to the third configuration of the present invention, the other end of the first non-linear resistance element is connected to one source/drain region. In the memory cell according to the third configuration of the present invention, therefore, so long as the second non-linear resistance element in the above various second non-linear resistance element constitutions comprises at least one source/drain region, the said source/drain region is required to be the source/drain region different from the source/drain region to which the other end of the first non-linear resistance element is connected.

Further, the erase-line potential may be applied to the erase line EL (more specifically, the read line RL, the common or source line and the channel forming region), in a state where the word line WL and the bit line BL are brought into a floating state. In this case, the second non-linear resistance element comprises the first gate, the insulation layer, both of the source/drain regions and the channel forming regions.

[Explanation of Operational Principle of the Memory Cell According to the Second or Third Configuration of the Present Invention (No. 1)]

Figure 4A:
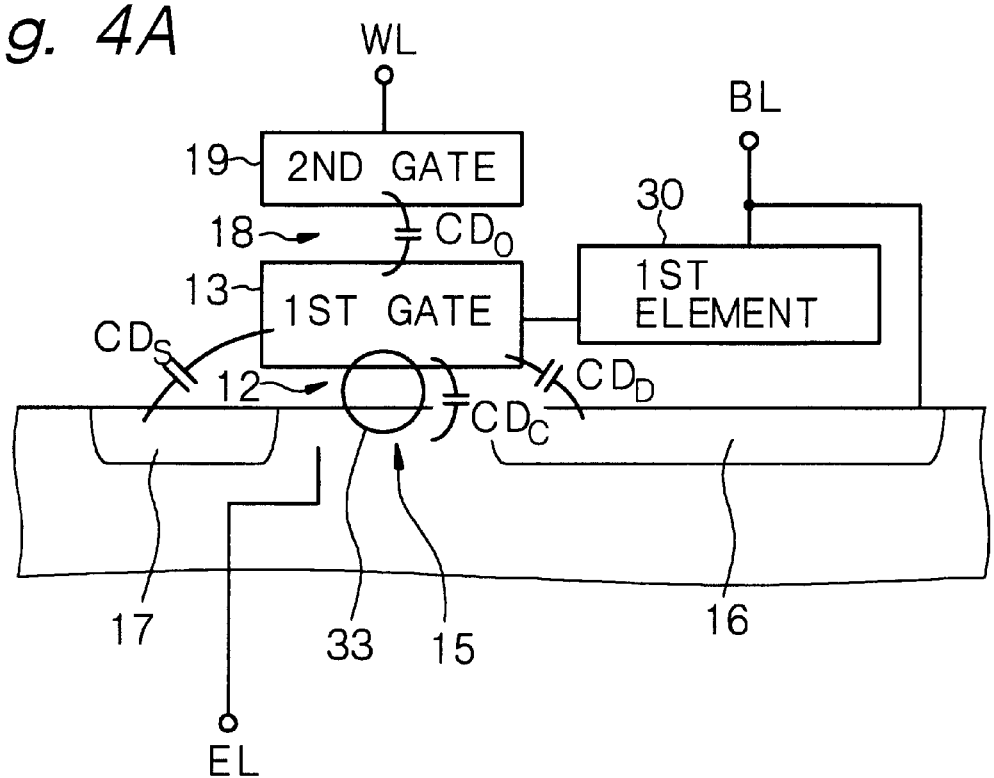
FIG. 4A shows a fundamental, principle drawing.
Figure 4B:
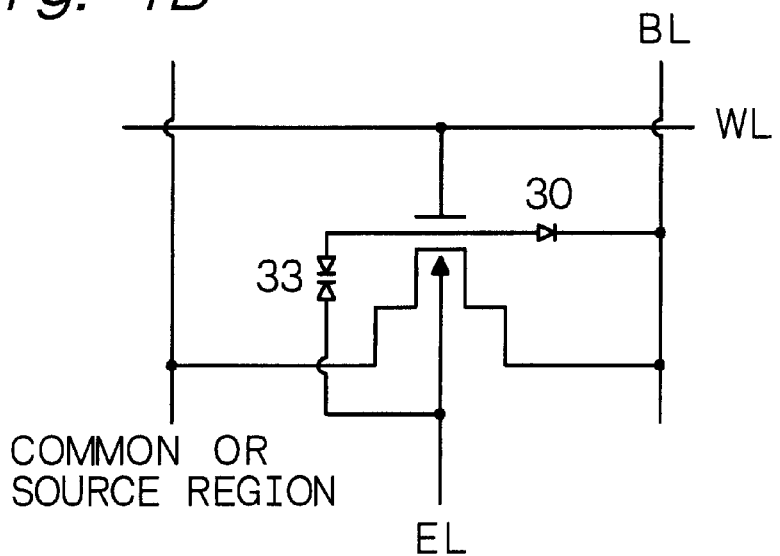
FIG. 4B shows an equivalent circuit of the memory cell according to the second configuration of the present invention.
Figure 5:
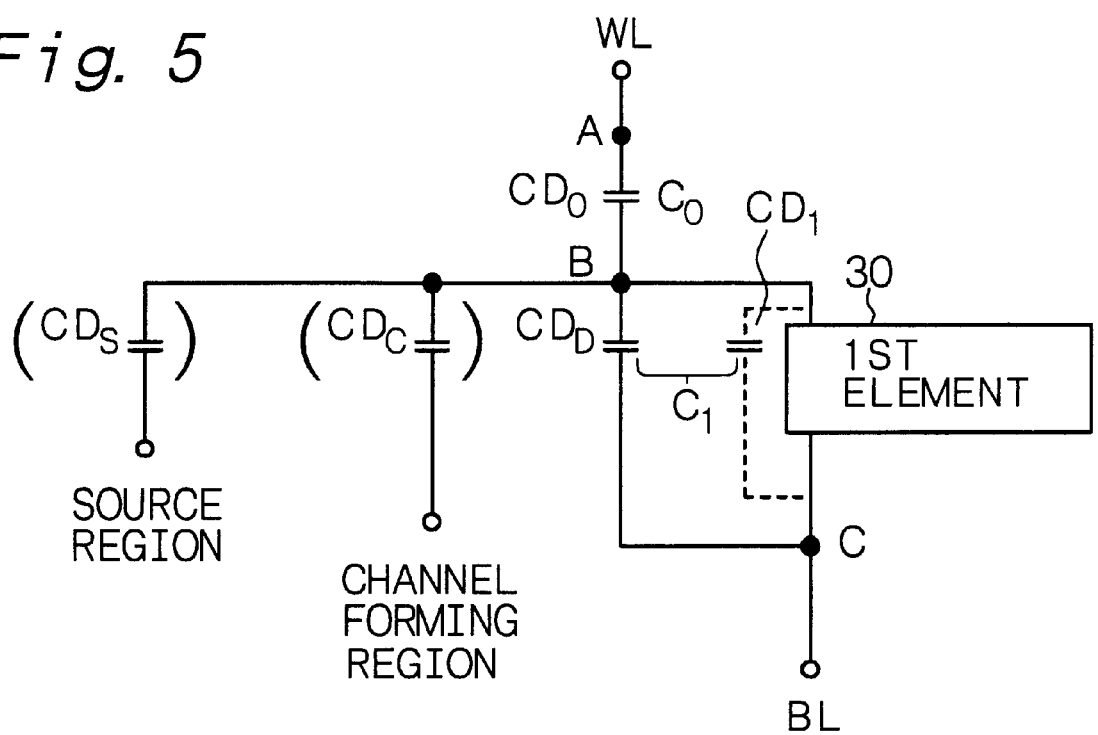
FIG. 5 shows an equivalent circuit of the memory cell according to the second configuration of the present invention.
Figure 6A:
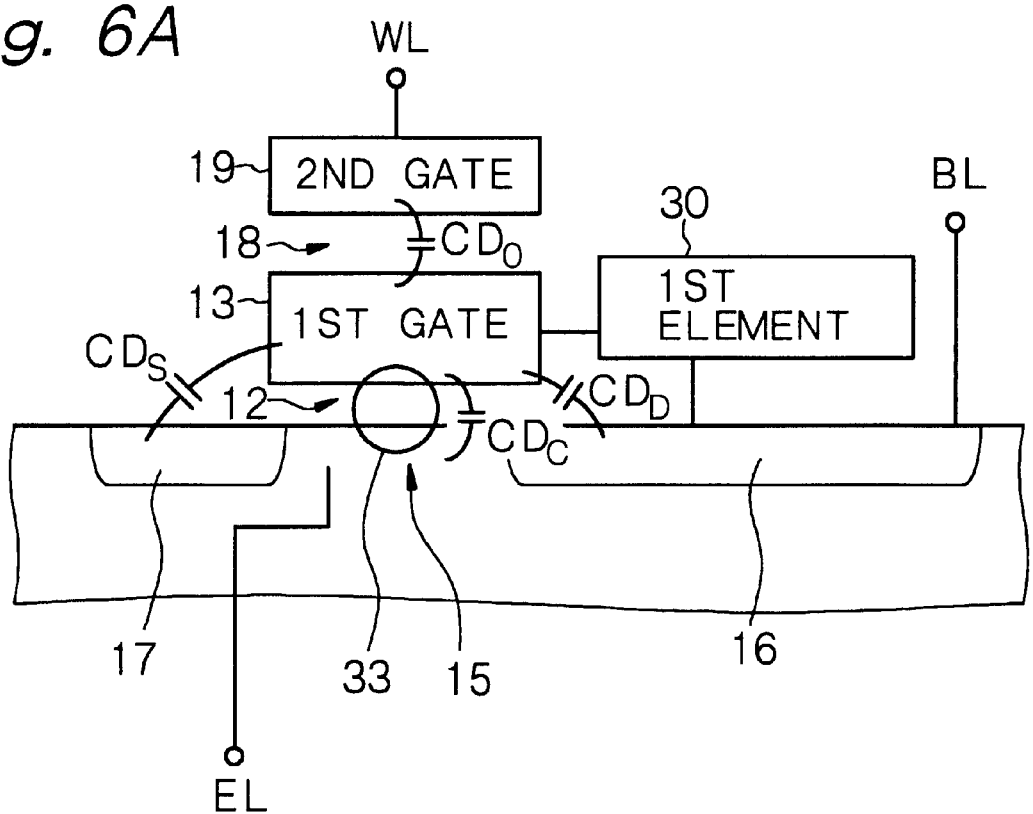
FIG. 6A shows a fundamental, principle drawing.
Figure 6B:
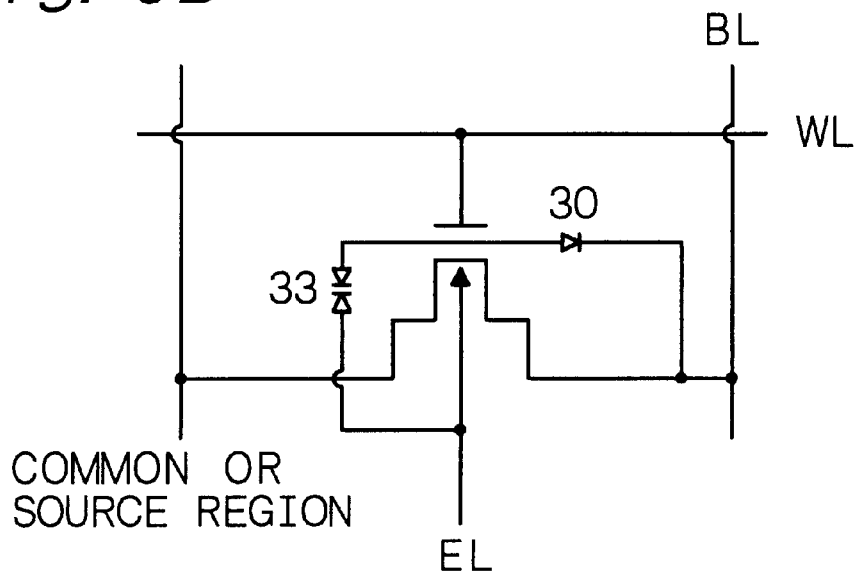
FIG. 6B shows an equivalent circuit of the memory cell according to the third configuration of the present invention.

The operational principle of the memory cell according to the second or third configuration of the present invention will be explained hereinafter. FIG. 4A shows a fundamental, principle drawing of the memory cell according to the second configuration of the present invention, and FIG. 4B and FIG. 5 show equivalent circuits. FIG. 6A shows a fundamental, principle drawing of the memory cell according to the third configuration of the present invention, and FIG. 6B shows an equivalent circuit. The following explanation refers to an n-type memory cell as an example, while a p-type memory cell operates similarly except that potentials, etc., reversely change.

The memory cells according to the second and third configurations of the present invention differ from the memory cell according to the first configuration of the present invention in the connection of the other end of the first non-linear resistance element 30 or one source/drain region 16. The memory cells according to the second and third configurations of the present invention are the same as the memory cell according to the first configuration of the present invention in other constitutions. That is, in the memory cell according to the second configuration of the present invention, the other end of the first non-linear resistance element 30 and one source/drain region 16 are connected to the bit line BL. In the memory cell according to the third configuration of the present invention, the other end of the first non-linear resistance element 30 is connected to one source/drain region 16, and said one source/drain region 16 is connected to the bit line BL.

In the equivalent circuit of the memory cell according to the second or third configuration of the present invention, shown in FIG. 5, symbol $C_1$ stands for a parallel composite capacitance of the capacitor $CD_D$ composed of one source/drain region 16, the insulation layer 12 and the first gate 13 and the parasitic capacitor of the first non-linear resistance element 30, unlike in the equivalent circuit of the memory cell according to the first configuration of the present invention shown in FIG. 2. The composite capacitance $C_1$ is generally greater than the capacitance of each of the capacitors $CD_C$ and $CD_S$ in many cases, and the capacitance $C_C$ of the capacitor $CD_C$ and the capacitance $C_S$ of the capacitor $CD_S$ will be omitted in an explanation to follow. The V-I characteristic of the first non-linear resistance element 30 can be considered the same as that shown in FIG. 3.

In the memory cell according to the second or third configuration of the present invention, a charge stored on or in the first gate 13 corresponds to stored information as well. Initial conditions of the memory are assumed, for example, to be as shown in the following Table 3. Specifically, the values of $V_{WL1}$, $\gamma V_{WL1}$, $V_{BL0}$ and $V_S$ can be set at values close to 0 volt.

TABLE 3

| Potential of second gate (first word-line potential) | : $V_{WL1}$ |
|---|---|
| Potential of first gate | : $\gamma V_{WL1}$ |
| Potential of bit line | : $V_{BL0}$ |
| Potential of source region | : $V_S$ |

[Writing of Information]

The operational principle of writing information in the memory cell is the same as that explained with regard to the memory cell according to the first configuration of the present invention, and detailed explanations thereof are therefore omitted.

[Readout of Information]

The gate threshold voltage in the memory cell differs depending upon whether or not a charge is stored on or in the first gate 13. The gate threshold voltage when information is stored in the memory cell is assumed to be $V_{th\_H}$. On the other hand, the gate threshold voltage when no information is stored in the memory cell is assumed to be $V_{th\_L}$. When information stored in the memory cell is read out, the potentials of the word line and the bit line are assumed to be, for example, as shown in Table 4.

TABLE 4

| Potential of second gate (word-line potential) | : $V_{WL-R}$ |
|---|---|
| Potential of bit line | : $V_{BL-R}$ |
| Potential of source region | : $V_S$ |

However, the potential $V_{WL-R}$ of the second gate (word-line potential) is set so as to satisfy $V_{th\_L} < V_{WL-R} < V_{th\_H}$. Further, the potential $V_{BL-R}$ of the bit line can be set so as to satisfy $V_{BL0} < V_{BL-R} < V_{BL2}$.

As a result, the first non-linear resistance element 30 is kept in a high resistive state. When information is stored in the memory cell, the memory cell continues to be kept in an off-state. On the other hand, when no information is stored in the memory cell, the memory cell is in an on-state. By detecting whether or not a current flows through the source/drain regions 16 and 17 of the memory cell, therefore, it can be determined whether or not information is stored in the memory cell.

[Erasing of Information]

The operational principle in erasing information stored in the memory cell is the same as that explained with regard to the memory cell according to the first configuration of the present invention, and detailed explanations thereof are therefore omitted.

Further, the operational principle when the information stored on or in the first gate 13 is multi-valued information can be also, in principle, the same as that explained with regard to the memory cell according to the first configuration of the present invention, and detailed explanations thereof are omitted.

[Explanation of Operational Principle of the Memory Cell According to the First, Second or Third Configuration of the Present Invention (No. 2)]

In the memory cell according to the first configuration of the present invention, the capacitance $C_D$ of the capacitor $CD_D$, the capacitance $C_C$ of the capacitor $CD_C$, the capacitance $C_S$ of the capacitor $CD_S$ and the capacitance $C_1$ of the parasitic capacitor $CD_1$ of the first non-linear resistance element 30 are negligibly small in some cases depending upon the structure and the size of the memory cell. The operational principle of the memory cell will be explained by taking into consideration the capacitance $C_0$ of the capacitor $CD_0$ alone hereinafter. In this case, the proportional constant γ determined on the basis of the capacitance ratio is close to 1. The V-I characteristic of the first non-linear resistance element 30 can be the same as that shown in FIG. 3. Further, the operational principles of the memory cells according to the second and third configurations of the present invention are, in principle, the same as that of the memory cell according to the first configuration of the present invention to be described later, and explanations of the operational principles of the memory cells according to the second and third configurations of the present invention are therefore omitted.

Initial conditions of the memory cell can be, for example, as shown in the above Table 1.

[Writing of Information]

The procedure of writing information in the memory cell can be the same as that explained in [Explanation of operational principle of memory cell according to the first configuration of the present invention (No. 1)]. Potentials $V_A$, $V_B$ and $V_C$ in sites A, B and C in FIG. 2 are as follows.

$$V_A = V_{WL2} \tag{7-1}$$

$$V_B = \gamma V_{WL2} \tag{7-2}$$

$$V_C = V_{BL1} \tag{7-3}$$

If the value of $(V_B - V_{BL1})$ is greater than $V_{F1}$, the first non-linear resistance element 30 is brought into a low resistive state. In other words, if $V_{WL2}$ and $V_{BL1}$ are selected so as to satisfy the following expression (8), i.e., if the first voltage is generated between the first gate 13 and the other end of the first non-linear resistance element 30, the first non-linear resistance element 30 is brought into a low resistive state. As a result, the first gate 13 is brought from a nearly floating state where it is connected to the bit line BL in an initial high resistive state, to a state where it is connected to the bit line BL at a low resistance.

$$|\gamma V_{WL2} - V_{BL1}| > |V_{F1}| \tag{8}$$

As a consequence, the potential difference $V_{AB}$ between the sites A and B, seen from the site B (i.e., seen from the first gate 13) is as shown in the following expression (9).

$$V_{AB} \approx V_{WL2} - V_{F1} - V_{BL1} \tag{9}$$

Then, the potential of the second gate 19 is switched from the second word-line potential $V_{WL2}$ to the first word-line potential $V_{WL1}$ and then the potential of the bit line BL is switched to $V_{BL0}$. As a result, the first non-linear resistance element 30 is brought into a high resistive state. And, the first gate 13 is again brought into a nearly floating state, and a negative charge $Q_F$ of a first polarity is freshly stored on or in the first gate 13. The above negative charge ($Q_F$) stored on or in the first gate 13 corresponds to information stored in the memory cell.

On the other hand, when it is not necessary to write information on the memory cell while writing information in other memory cells, first, a second bit-line potential $V_{BL2}$ is applied to the bit line BL, and then the word-line potential is switched from the first word-line potential $V_{WL1}$ to the second word-line potential $V_{WL2}(\gg V_{F1})$. In this case, when potentials in the sites A, B and C in FIG. 2 are assumed to be $V_A$, $V_B$ and $V_C$, respectively, $V_A$, $V_B$ and $V_C$ are as shown below.

$$V_A = V_{WL2} \tag{10-1}$$

$$V_B = \gamma V_{WL2} \tag{10-2}$$

$$V_C = V_{BL2} \tag{10-3}$$

If the value of $(V_B - V_C) [= \gamma V_{WL2} - V_{BL2}]$ is less than $V_{F1}$, the first non-linear resistance element 30 is kept in a high resistive state. In other words, when a voltage (second voltage) having the same polarity as that of the forward conduction voltage ($V_{F1}$) and having an absolute value smaller than the absolute value of the forward conduction voltage ($V_{F1}$), or a voltage having a polarity opposite to the forward conduction voltage ($V_{F1}$), is generated between the first gate 13 and the other end of the first non-linear resistance element 30, i.e., when $V_{BL2}$ is selected so as to satisfy the following expression (11), the first non-linear resistance element 30 is kept in a high resistive state. As a result, the first gate 13 continues to be kept nearly in a floating state.

$$\gamma V_{WL2} - V_{BL2} < V_{F1} \tag{11}$$

Then, the potential of the second gate 19 is switched from the second word-line potential $V_{WL2}$ to the first word-line potential $V_{WL1}$, and then the potential of the bit line is switched to $V_{BL0}$. As a result, a temporary charge induced on the capacitor $CD_0$ is discharged, and no charge is stored on or in the first gate 13. In other words, charging and discharging which occur through the first non-linear resistance element 30 are negligibly small, and therefore, the first gate 13 is brought back to an initial state. That is, substantially, no information is written in the memory cell.

For reliably preventing the flowing of current between the source/drain regions 16 and 17 of the memory cell when information is written, preferably, the other source/drain region (the source region 17) is reversely biased with regard to the channel forming region 15, or the other source/drain region (the source region 17) is brought into a floating state with regard to the channel forming region 15. Specifically, the same procedures as those explained in [Explanation of the operational principle of memory cell according to the first configuration of the present invention (No. 1)] can be carried out.

In a standby state, the potential of the word line WL is kept at a potential at which the memory cell is not brought into an on-state (state in which a current flows between the source/drain regions 16 and 17). Specifically, the word line WL is kept at a potential equal to, or lower than, $V_{th\_L}$ to be described later. On the other hand, there can be another state where other memory cell connected to the bit line BL is operating. It is therefore required to be secured that the current flowing through the first non-linear resistance element 30 of the memory cell is $I_{R1}$ even when the bit line BL has a potential of $V_{BL2}$ and the first gate 13 of the memory cell has a potential of $V_{INF}$. Therefore, the potential of the word line WL in a standby state is required not to be lower than $|V_{INF}|$.

[Readout of Information]

The operational principle of readout of information can be the same as that explained in [Explanation of operational principle of memory cell according to the first configuration of the present invention (No. 1)], and detailed explanations thereof are therefore omitted.

[Erasing of Information]

The operational principle of erasing of information stored in the memory cell is the same as that explained with regard to the memory cell according to the first configuration of the present invention, and explanations thereof are therefore omitted.

The operational principle and the readout principle when information stored on or in the first gate 13 is multi-valued information are the same as those explained already, and detailed explanations thereof are therefore omitted.

In the memory cell, provided by the present invention, a simple-structured DRAM gain cell can be produced by combining the first gate, the second gate, the first non-linear resistance element and the second non-linear resistance element as described above. Further, the production process thereof is not much complicated, and it can be produced almost equally by applying a process of producing a conventional flash memory. In the memory cell according to the second or third configuration of the present invention, it is possible to suppress an increase in the number of external wiring and the area of a terminal portion. Moreover, no complicate-structured capacitor is required unlike a conventional DRAM, and the capacitor which a conventional DRAM requires is, in principle, not required although it is required as an auxiliary in some cases. In the memory cell, provided by the present invention, therefore, the cell area is greatly increased in no case.

EXAMPLE 1

Figure 7A:
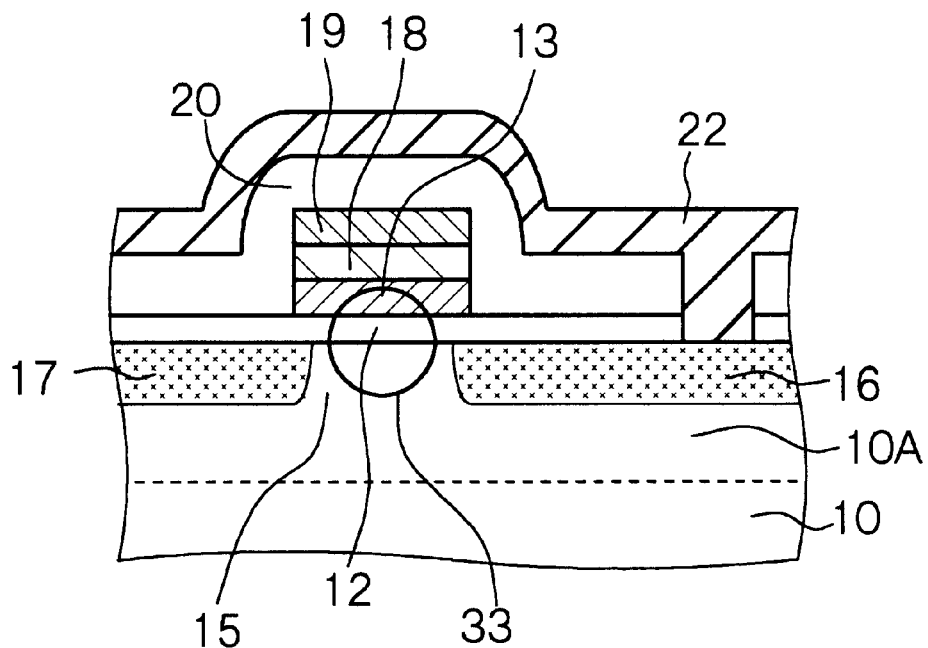
FIGS. 7A and 7B are schematic cross sectional views of the memory cell in Example 1.
Figure 7B:
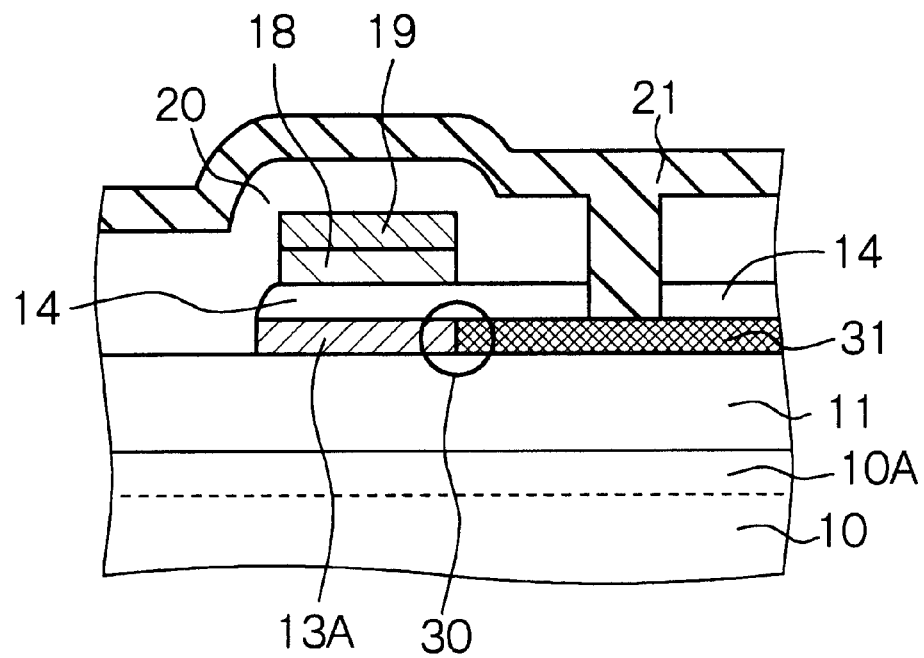
Figure 8A:
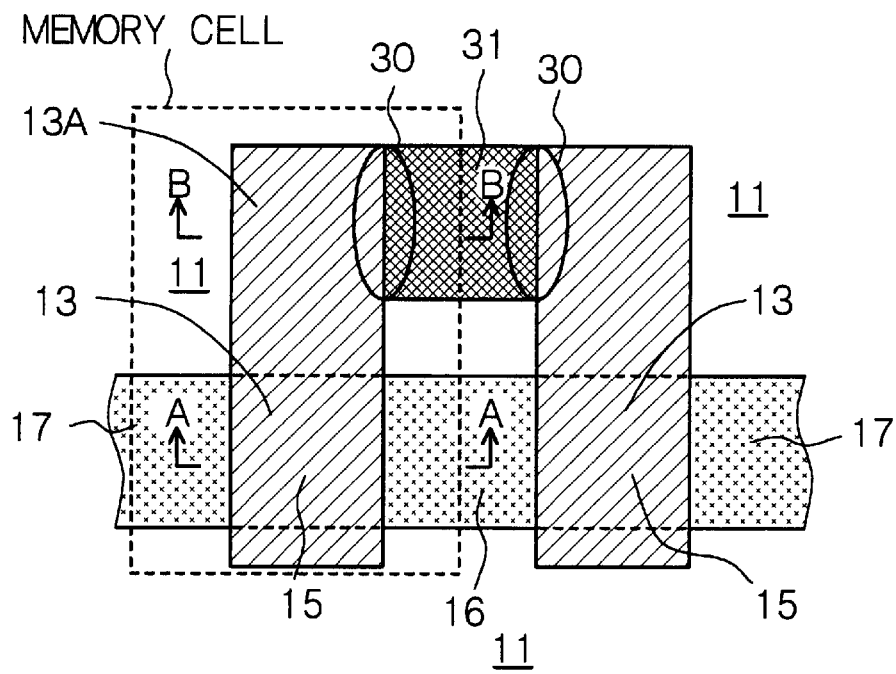
FIG. 8A shows a schematic and partial layout of the memory cell in Example 1 and FIG. 8B shows a schematic and partial layout of a patterned silicon thin film and an etching stopper layer in Example 1.

Example 1 is concerned with the memory cell according to the first configuration of the present invention. FIG. 1A shows the principle of the memory cell of Example 1, FIG. 1B and FIG. 2 show equivalent circuits of the memory cell of Example 1, and FIGS. 7A and 7B schematically show partial cross-sectional views of the memory cell of Example 1. Further, FIG. 8A schematically shows the layout of a first gate 13, an extended region 13A of the first gate 13, a channel forming region 15, a drain region 16, a source region 17 and a first non-linear resistance element 30 in each of memory cells adjacent to each other. FIG. 7A is a schematic, partial cross sectional view taken along arrows A—A in FIG. 8A, and FIG. 7B is a schematic, partial cross sectional view taken along arrows B—B in FIG. 8A.

The memory cell of Example 1 has the channel forming region 15, an insulation layer 12 which is a so-called gate insulation layer, the first gate 13 formed on the insulation layer 12, the first gate 13 facing the channel forming region 15 through the insulation layer 12, a second gate 19 capacitively coupled with the first gate 13, the source/drain regions 16 and 17 (the drain region 16 and the source region 17) formed in contact with the channel-forming region 15 and spaced from each other, the first non-linear resistance element 30 having two ends, and a second non-linear resistance element 33. The above capacitive coupling is formed by sandwiching a dielectric film 18 with the first gate 13 and the second gate 19. Reference numeral 10 shows a semiconductor substrate, and reference numeral 10A shows a well which is formed in the surface of the semiconductor substrate 10 as required. When the memory cell is an n-channel type, the well 10A has a p-type conductivity, and when the memory cell is a p-channel type, the well 10A has an n-type conductivity. In drawings other than FIG. 7, no well is shown for simplification of showing. Reference numeral 11 shows a device separation (isolation) region, reference numeral 14 shows an etching stopper layer, and reference numeral 20 shows an insulation interlayer.

The second non-linear resistance element 33 comprises the first gate 13, the insulation layer 12 and the channel-forming region 15. That is, the second non-linear resistance element 33 comprises a MOS tunnel diode. The insulation layer is formed, for example, of $SiO_2$ (silicon oxide layer) having a thickness of 2 nm. When a proper potential (for example, −4 volts) is applied to the insulation layer 12 having the above thickness, a tunneling current flows in the insulation layer 12, and an electronic charge stored in the first gate 13 is discharged for several hundreds nanoseconds. Further, when the insulation layer 12 has a thickness of 2 nm, according to FIG. 9 in the literature "Sub-5 nm Multiple-Thickness Gate Oxide Technology Using Oxygen Implantation", Y. C. King, et al., IEDM 98-585, a $Q_{BD}$ value (amount of charge which flows in the insulation layer until a dielectric breakdown takes place) of $10^5$ $C/cm^2$ can be obtained. If the tunneling current is $10^{-5}$ $A/cm^2$, a lifetime of over 20 years can be secured before the dielectric breakdown.

In Example 1, the second gate 19 is connected to a word line WL, and one source/drain region (the drain region 16) is connected to a read line (RL) 22. The channel forming region 15 is connected to an erase line (not specifically shown). In Examples, the second gate 19 has a common region with the word line WL.

One end of the first non-linear resistance element 30 is connected to the first gate 13, and the other end thereof is connected to a bit line (BL) 21. The above first non-linear resistance element 30 has a two-terminal operation characteristic, and further specifically, it has characteristics that when the first voltage having the same polarity as that of the forward conduction voltage ($V_{F1}$) and having an absolute value equal to, or greater than, the absolute value of the forward conduction voltage ($V_{F1}$) is applied across the two ends, it is brought into a low resistive state, and that when the second voltage having the same polarity as that of the forward conduction voltage ($V_{F1}$) and having an absolute value smaller than the absolute value of the forward conduction voltage ($V_{F1}$) or a voltage having an opposite polarity to the forward conduction voltage ($V_{F1}$) is applied across the two ends, it is brought into a high resistive state, as shown in FIG. 3. That is, the first non-linear resistance element 30 has a characteristic that when a predetermined voltage is applied, it is brought into a low resistive state. Specifically, the first non-linear resistance element 30 comprises a pn junction diode.

The first non-linear resistance element 30 comprising a pn junction diode is formed in the first gate extended region 13A which extends on an insulation region (insulation layer of the device separation region 11 having a LOCOS structure or a trench structure in Example 1). The pn junction diode has a semiconductor region 31 which is the same as the source/drain regions 16 and 17 in conductivity type and a semiconductor region (the first gate extended region 13A in Example 1) which is opposite to the source/drain regions 16 and 17 in conductivity type. The first gate extended region 13A which is opposite to the source/drain regions 16 and 17 in conductivity type corresponds to one end of the first non-linear resistance element 30. On the other hand, the semiconductor region 31 which is the same as the source/drain regions 16 and 17 in conductivity type corresponds to the other end of the first non-linear resistance element 30. Specifically, the semiconductor region 31 containing an n-type dopant (impurity) is formed in the first gate extended region 13A [containing a $p^+$-type dopant (impurity)], and a lateral pn junction is formed in the first gate extended region 13A. The semiconductor region 31 corresponding to the other end of the first non-linear resistance element 30 is connected to the bit line (BL) 21. In FIG. 8A, the pn junction region is positioned on a line extending from an end portion of the first gate 13, while the position of the pn junction region may change depending upon the dopant (impurity) concentration in the first gate extended region 13A and the dopant (impurity) concentration in the semiconductor region 31 or the form of a mask used for introducing a dopant.

Figure 9A:
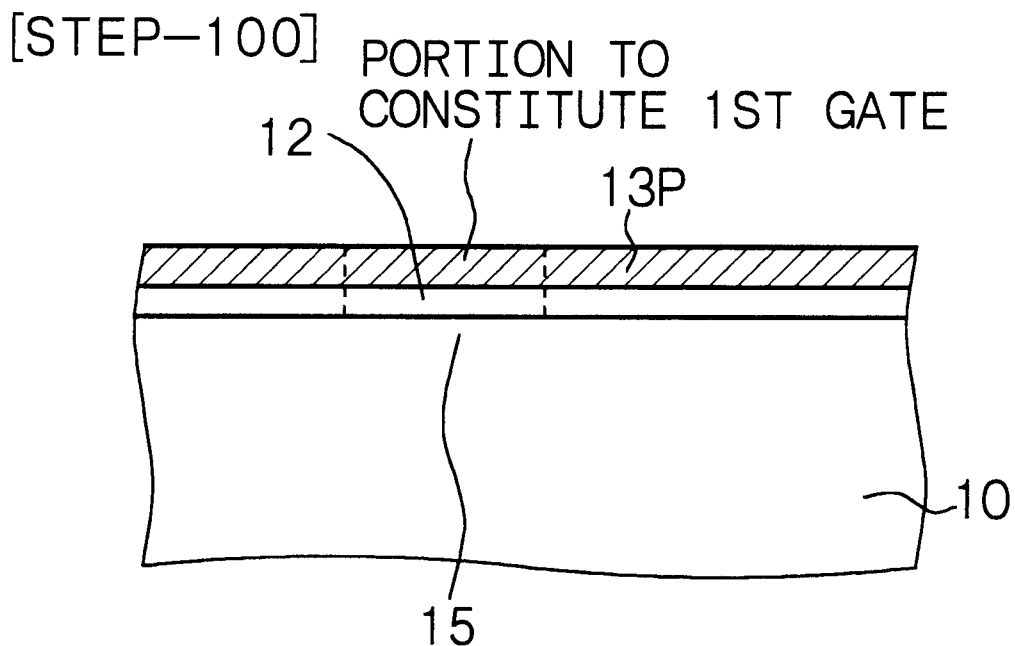
FIGS. 9A and 9B are schematic, partial cross-sectional views of a semiconductor substrate, etc., for explaining the process for the manufacture of the memory cell in Example 1.
Figure 9B:
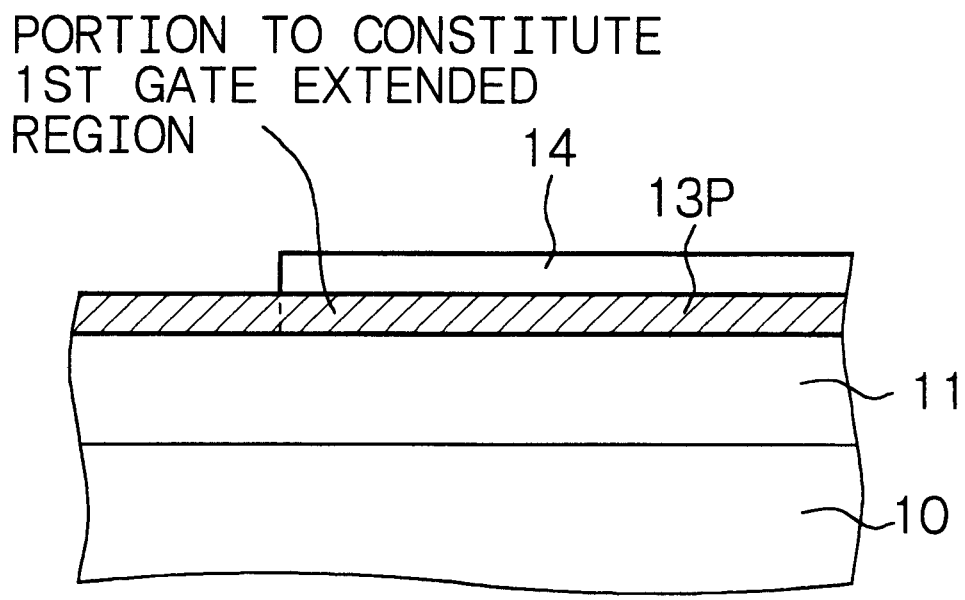
Figure 10A:
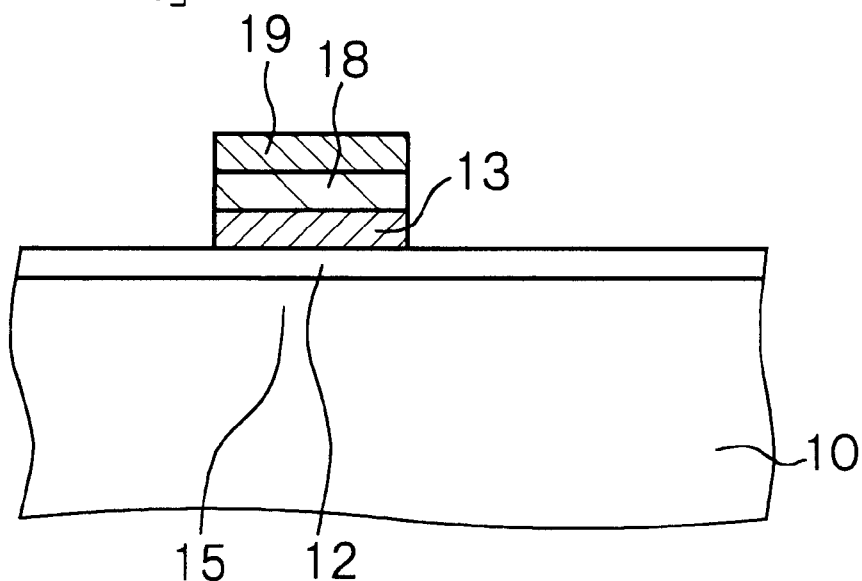
FIGS. 10A and 10B, following
Figure 10B:
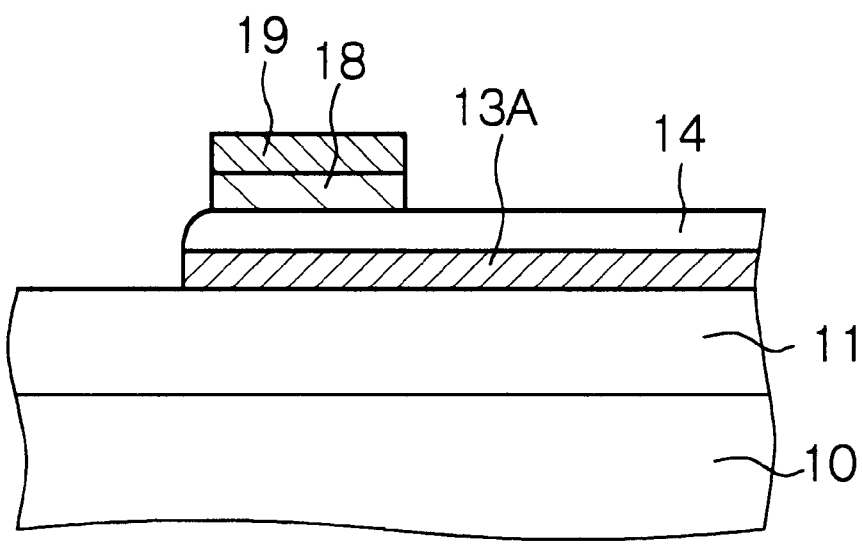
Figure 11A:
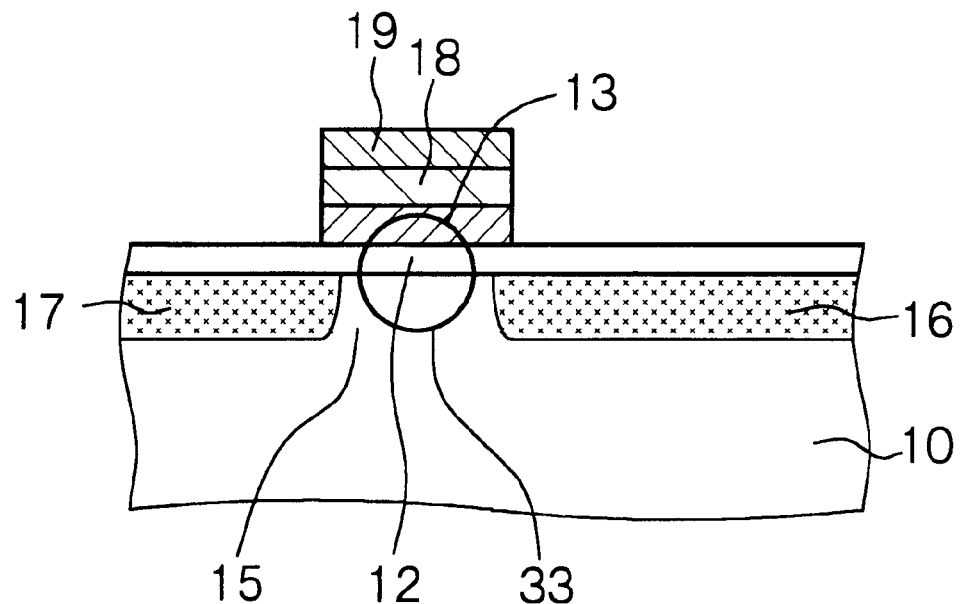
FIGS. 11A and 11B, following
Figure 11B:
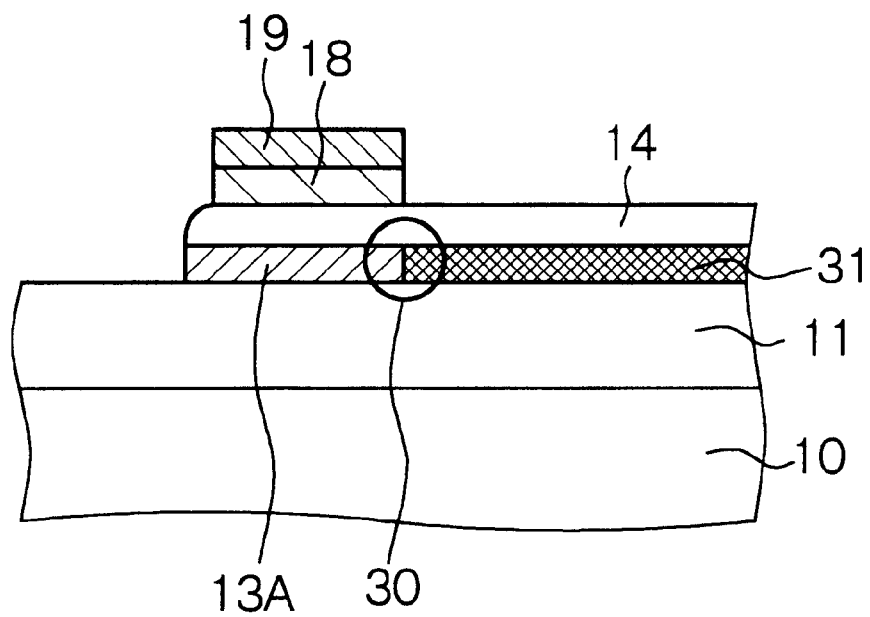

The process for the manufacture of the memory cell of Example 1 shown in FIGS. 7 and 8A will be explained with reference to FIGS. 9A, 9B, 10A, 10B, 11A and 11B which are schematic, partial cross-sectional views of the semiconductor substrate 10 and the like. FIGS. 9A, 10A and 11A are schematic, partial cross-sectional views similar to that taken along arrows A—A in FIG. 8A. FIGS. 9B, 10B and 11B are schematic, partial cross-sectional views similar to that taken along arrows B—B in FIG. 8A.

[Step-100]

Figure 8B:
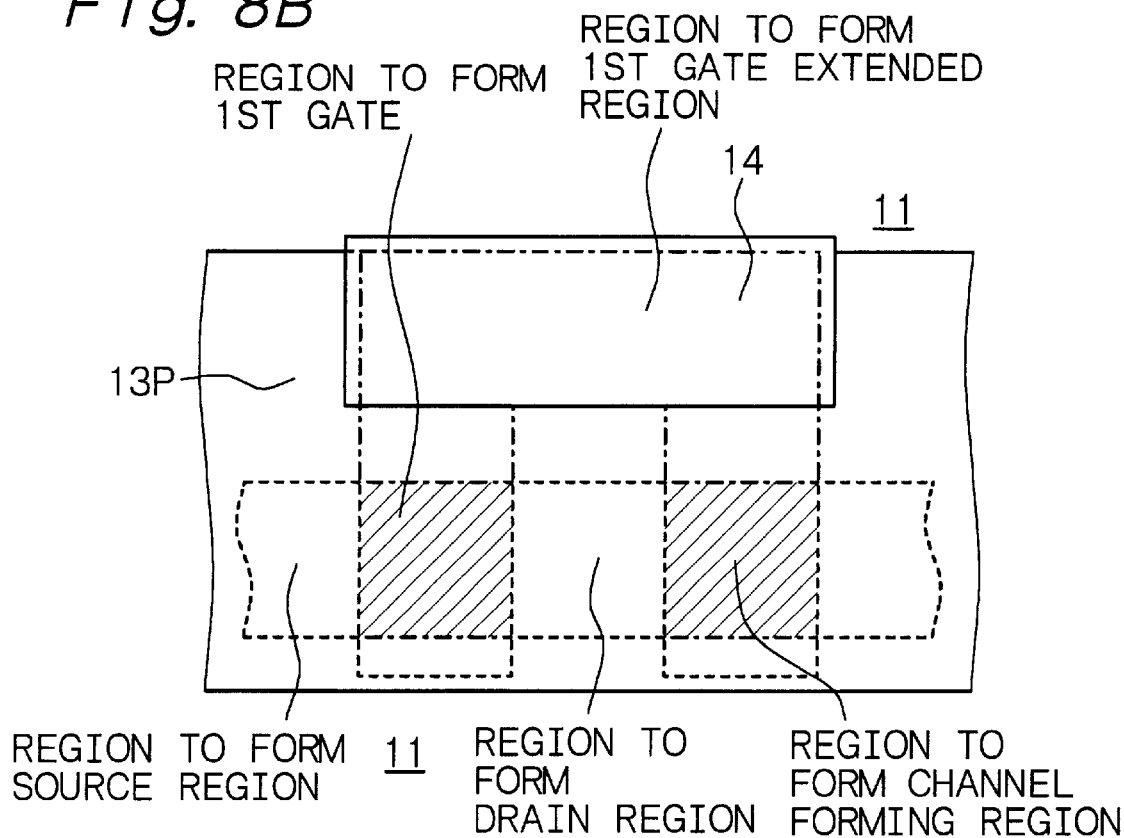

First, the device separation region 11 having a LOCOS structure or a trench structure is formed in the semiconductor substrate 10 by a known method. Then, the semiconductor substrate 10 is ion-implanted with a p-type dopant (impurity) for forming the channel forming region 15. Then, the insulation layer 12 having a thickness of 3 to 1.5 nm and corresponding to a gate insulation layer is formed on the surface of the semiconductor substrate 10 by a thermal oxidation method of treating the surface of the semiconductor substrate 10 or a method of carrying out thermal nitriding after the thermal oxidation. Thereafter, a silicon thin film 13P (which may be a polysilicon thin film or an amorphous silicon thin film) doped, for example, with a p-type dopant is deposited on the entire surface by a CVD method, and then the silicon film 13P is patterned such that at least plane shapes identical with the plane shapes of the first gate 13 and the first gate extended region 13A are retained. Then, the etching stopper layer 14, which has a larger thickness than the dielectric film 18 to be described later, is deposited, for example, of $SiO_2$. Then, the etching stopper layer 14 is patterned so as to retain a plane shape identical with the plane shape of the first gate extended region 13A to be formed later (see FIGS. 8B, 9A and 9B). FIG. 8B shows a schematic and partial layout of the patterned silicon thin film 13P and the etching stopper layer 14. In FIG. 8B, a region of the silicon thin film 13P on a region to form the first gate 13 is provided with slanting lines. Further, a region of the silicon thin film 13P on a region to form the first gate extended region 13A is surrounded by an alternate long and short dash line. Further, regions of the silicon thin film 13P on regions to form the drain region, the channel forming region and the source region are surrounded by dotted lines.

[Step-110]

Then, an insulation interlayer which works as the dielectric film 18 and is composed, for example, of $SiO_2$, $SiO_2/Si_xN_y$, $SiO_2/Si_xN_y/SiO_2$ or $Ta_2O_5/Si_xN_y$ is formed on the entire surface by a CVD method, a thermal oxidation method, a thermal nitriding method or a plasma nitriding method. Then, a polysilicon layer doped, for example, with an n-type dopant is deposited on the entire surface by a CVD method, and then the polysilicon layer, the dielectric film 18 and the silicon thin film 13P are consecutively patterned through one etching mask (not shown), whereby the second gate 19 and the first gate 13 are formed. The first gate 13 is formed of the silicon thin film, and the second gate 19 is formed of the polysilicon layer. Further, the channel forming region 15 is formed below the first gate 13. In this case, the silicon thin film 13P which is to constitute the first gate extended region 13A is left below the patterned etching stopper layer 14. That is, the first gate extended region 13A is formed outside the second gate 19 as well when viewed as a plan view (see FIGS. 10A and 10B). Further, part of the first gate extended region 13A is formed below the second gate 19. The second gate 19 has a common region with the word line WL.

[Step-120]

Then, the semiconductor substrate 10 and part of the first gate extended region 13A are ion-implanted with, for example, an n-type dopant, thereby to form the drain region 16 and the source region 17 and also to form the semiconductor region 31 in part of the first gate extended region 13A (see FIGS. 11A and 11B). In this manner, the first non-linear resistance element 30 which comprises a pn junction diode and has a pn junction region can be produced. Further, the second non-linear resistance element comprising the first gate 13, the insulation layer 12 and the channel forming region 15 can be produced.

[Step-130]

Then, the insulation interlayer 20 formed, for example, of $SiO_2$ is deposited on the entire surface by a CVD method, and then opening portions are formed in the insulation interlayer 20 above the drain region 16 and the semiconductor region 31. A wiring layer of, for example, an aluminum alloy is deposited on the insulation interlayer 20 and in the above opening portions by a sputtering method, and then the wiring layer is patterned, thereby to form the bit line (BL) 21 electrically connected to the semiconductor region 31 which is the other end of the first non-linear resistance element 30 and the read line (RL) 22 electrically connected to the drain region 16. In this manner, the memory cell having a constitution shown in FIGS. 7 and 8A can be obtained.

EXAMPLE 2

Example 2 is a variant of Example 1. Example 2 differs from Example 1 in that the pn junction diode as a first non-linear resistance element 30 has a pn junction region (a region of a lateral pn junction) formed of a single crystal semiconductor. The other constitutions of the memory cell of Example 2 can be the same as those of the memory cell of Example 1. The process for the manufacture of the memory cell of Example 2 will be explained below.

[Step-200]

First, in the same manner as in [Step-100] in Example 1, the device separation region 11 having a LOCOS structure or a trench structure is formed in the semiconductor substrate 10, the semiconductor substrate 10 is ion-implanted with a p-type dopant, and the insulation layer 12 is formed. Then, a silicon thin layer is formed on the semiconductor substrate 10.

[Step-210]

The silicon thin layer corresponding at least to the first gate 13 and the first gate extended region 13A where the first non-linear resistance element 30 is to be formed, is ion-implanted with, for example, Si to make it amorphous. Then, a protective layer formed, for example, of $SiO_2$ or $Si_xN_y$ is deposited as required, and then the semiconductor substrate 10 is heated in an inert gas atmosphere at a temperature between 600° C. and 800° C. for 1 to 3 hours. As a result, a portion of the silicon thin layer corresponding to the first gate 13 and the first gate extended region 13A where the first non-linear resistance element 30 is to be formed, is single-crystallized or increased in particle size, to form a single crystal semiconductor region. Then, the single crystal semiconductor region is ion-implanted with, for example, a p-type dopant. Then, the single-crystallized silicon thin layer is patterned in the same manner as in [Step-100] of Example 1, and an etching stopper layer 14, which has a greater thickness than the dielectric film 18 to be described later is deposited, for example, of $SiO_2$. Then, the etching stopper layer 14 is patterned so as to retain a plane shape identical with the plane shape of the first gate extended region 13A to be formed later.

[Step-220]

Then, an insulation interlayer which works as the dielectric film 18 and is composed of, for example, $SiO_2$, $SiO_2/$ $Si_xN_y$, $SiO_2/Si_xN_y/SiO_2$ or $Ta_2O_5/Si_xN_y$ is formed on the entire surface by a CVD method, a thermal oxidation method, a thermal nitriding method or a plasma nitriding method. Then, a polysilicon layer doped, for example, with an n-type dopant is deposited on the entire surface by a CVD method, and then the polysilicon layer, the dielectric film 18 and the silicon thin film are consecutively patterned through one etching mask, whereby the second gate 19 and the first gate 13 are formed. The first gate 13 is formed of the single-crystallized silicon thin film, and the second gate 19 is formed of the polysilicon layer. Further, the channel forming region 15 is formed below the first gate 13. In this case, the single-crystallized silicon thin film which is to constitute the first gate extended region 13A is left below the patterned etching stopper layer 14. That is, the first gate extended region 13A composed of a single-crystallized semiconductor region is formed outside the second gate 19 when viewed as a plan view. Further, part of the first gate extended region 13A is formed below the second gate 19. The second gate 19 has a common region with the word line WL.

[Step-230]

Then, the semiconductor substrate 10 and part of the first gate extended region 13A are ion-implanted with, for example, an n-type dopant, thereby to form the drain region 16 and the source region 17 and also to form the semiconductor region 31 in the first gate extended region 13A. In this manner, a pn junction diode which constitutes the first non-linear resistance element 30 is formed, and the pn junction region (a region of a lateral pn junction) is formed of a single crystal semiconductor. Further, the second non-linear resistance element 33 composed of the first gate 13, the insulation layer 12 and the channel forming region 15 can be produced.

[Step-240]

Then, [Step-130] in Example 1 is carried out, whereby the memory cell having a constitution shown in FIGS. 7 and 8A can be obtained.

EXAMPLE 3

Figure 12:
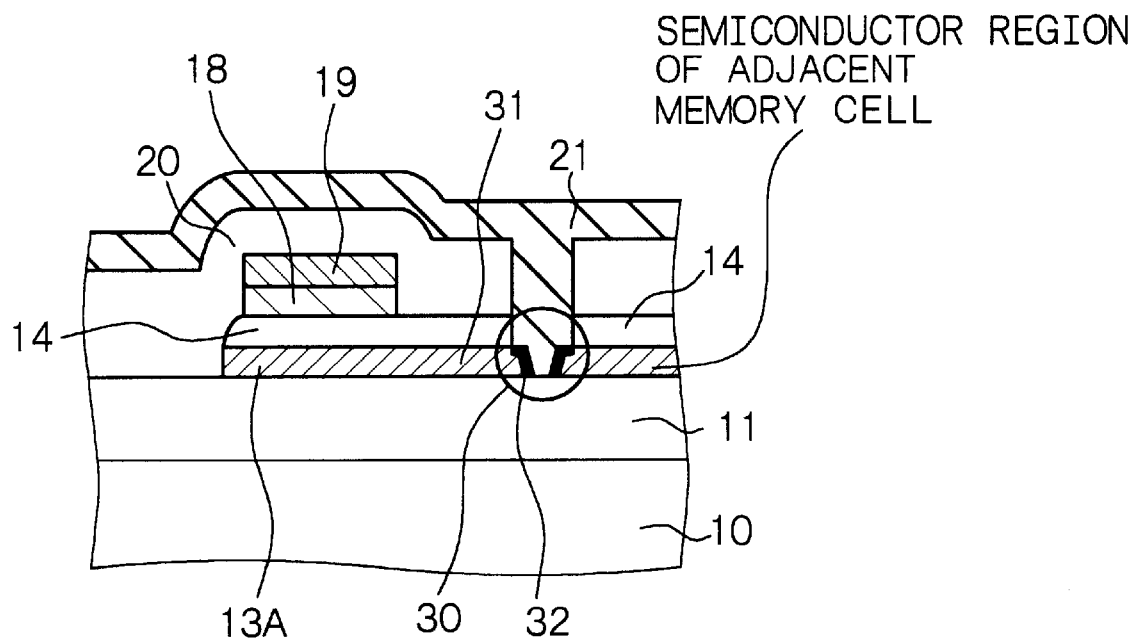
FIG. 12 is a schematic, partial cross-sectional view of a memory cell in Example 3.

Example 3 is also a variant of Example 1. Example 3 differs from Example 1 in that the first non-linear resistance element 30 comprises a hetero-junction diode (for example, Schottky barrier diode). FIG. 12 shows a schematic, partial cross-sectional view of the memory cell of Example 3, which is similar to that taken along arrows B—B in FIG. 8A. In Example 3, a silicide layer 32 is formed on the surface of part of the first gate extended region 13A. The other constitutions of the memory cell of Example 3 can be the same as those of the memory cell in Example 1. The process for the manufacture of the memory cell of Example 3 will be explained below. In Example 3, the conductivity types in various regions are opposite to those in Example 1. The first gate extended regions 13A of two adjacent memory cells in Example 3 are required to be separated from each other.

[Step-300]

First, in the same manner as in [Step-100] in Example 1, the device separation region 11 having a LOCOS structure or a trench structure is formed in the semiconductor substrate 10, the semiconductor substrate 10 is ion-implanted with an n-type dopant, and the insulation layer 12 is formed. Then, a silicon thin layer doped, for example, with an n-type dopant is deposited, and then, the silicon thin layer is patterned in the same manner as in [Step-100] in Example 1. The concentration of the n-type dopant is preferably equal to, or less than, $10^{19}$ atoms/cm$^3$ for securing a peak inverse voltage of the hetero-junction.

[Step-310]

The first gate 13, the first gate extended region 13A, the dielectric film 18 and the second gate 19 are formed in the same manner as in [Step-110] in Example 1. The first gate extended regions 13A are patterned such that the first gate extended regions 13A of the two adjacent memory cells are separated from each other.

[Step-320]

Then, the semiconductor substrate 10 is ion-implanted with a p-type dopant, to form the drain region 16 and the source region 17. In Example 3, the first gate extended region 13A is kept containing the n-type dopant without ion-implanting the p-type dopant, whereby the second non-linear resistance element 33 comprising the first gate 13, the insulation layer 12 and the channel forming region 15 can be produced.

[Step-330]

Then, an insulation interlayer 20 formed, for example, of $SiO_2$ is deposited on the entire surface by a CVD method, and then opening portions are formed in the insulation interlayer 20 above the drain region 16 and part of the first gate extended region 13A. And, for example, a titanium layer (not shown) is deposited on the insulation interlayer 20 and in the opening portions by a sputtering method and then is annealed, whereby Ti atoms of the titanium layer deposited in the bottom of each opening portion react with Si atoms of the first gate extended region 13A formed of polysilicon. As a result, a titanium silicide layer 32 is formed on the surface of the part of the first gate extended region 13A positioned in the bottom of the opening portion. Then, unreacted titanium layer is removed. Thereafter, a wiring layer of an aluminum alloy is deposited by a sputtering method, and the wiring layer is patterned to form the bit line (BL) 21 electrically connected to the titanium silicide layer 32 which is the other end of the first non-linear resistance element 30 and the read line RL (not shown in FIG. 12) electrically connected to the drain region 16. In this manner, the memory cell having a constitution shown in FIG. 12 can be obtained.

The material for forming the hetero-junction diode is not limited to titanium silicide, and it can be selected from, for example, cobalt silicide or tungsten silicide or can be selected from other metal materials such as molybdenum. When the first non-linear resistance element comprises the above hetero-junction diode, $F_{F1}$ can be controlled by properly selecting an annealing temperature or a metal for forming a silicide. Further, by combining Example 3 with Example 2, the first non-linear resistance element comprising a hetero-junction diode can be formed of a single crystal semiconductor.

EXAMPLE 4

Figure 13:
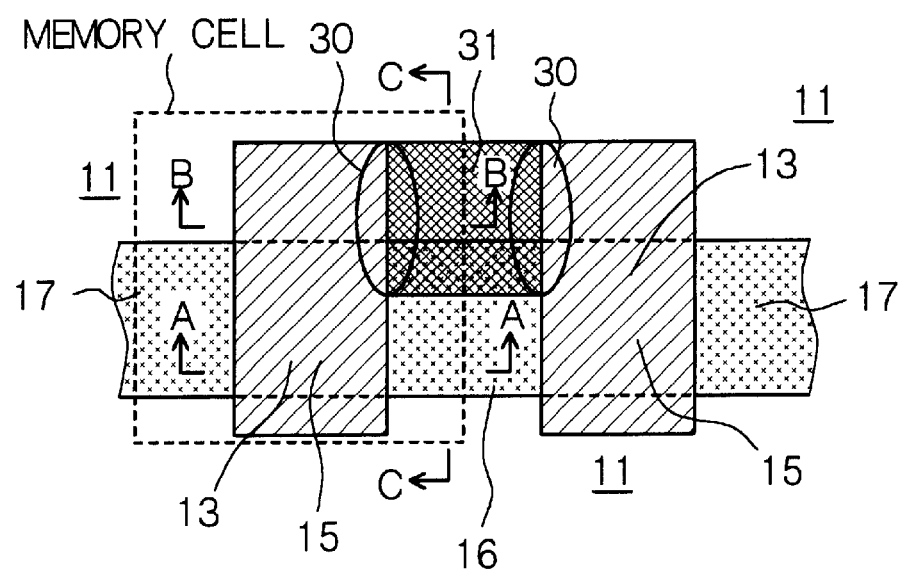
FIG. 13 is a schematic, partial layout of a memory cell in Example 4.
Figure 14A:
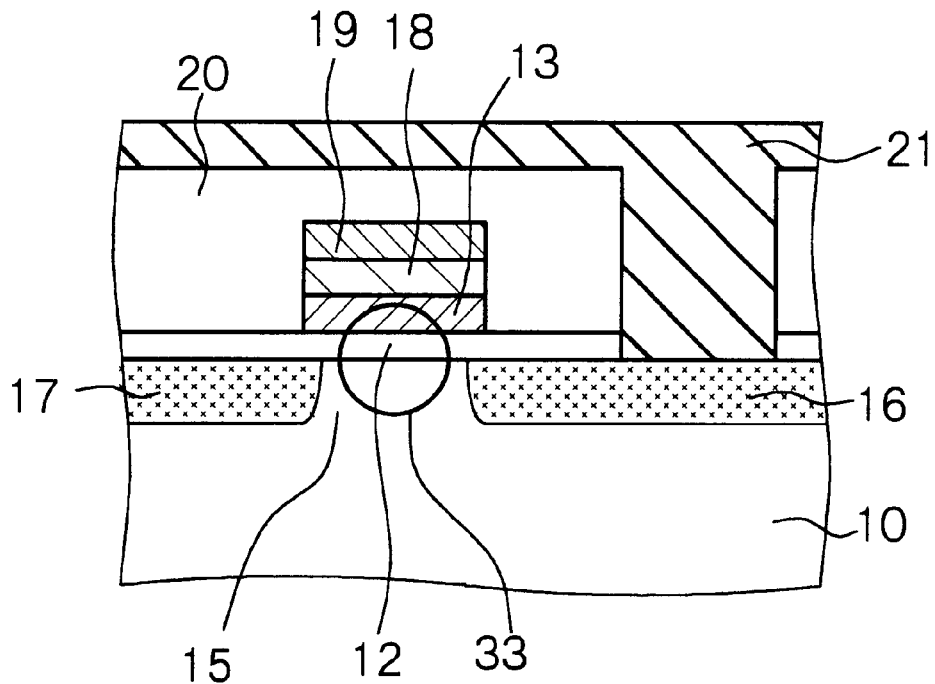
FIGS. 14A and 14B are schematic, partial cross-sectional views of the memory cell in Example 4.
Figure 14B:
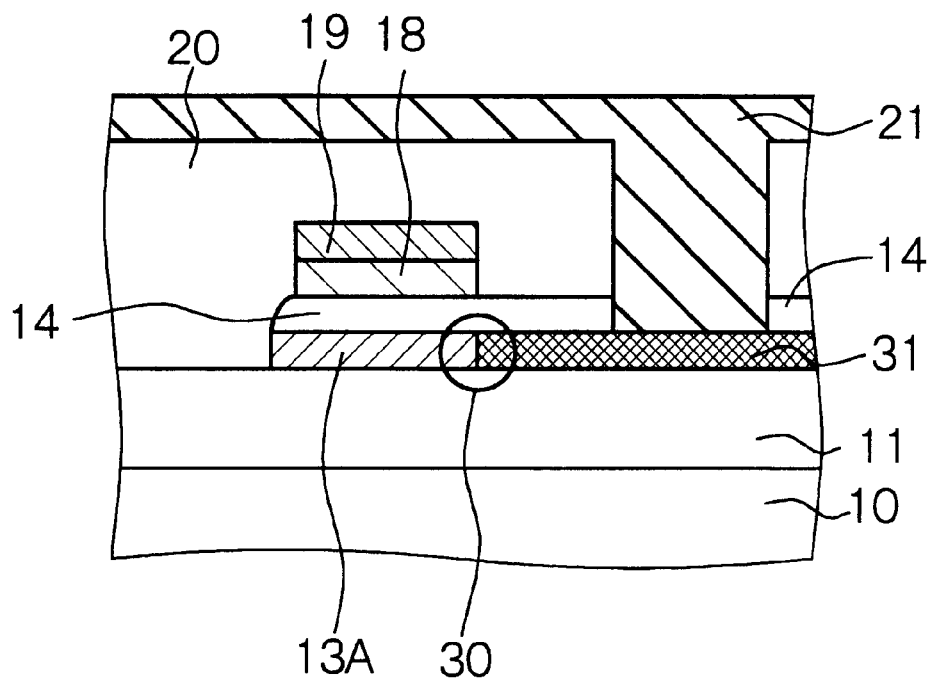
Figure 15A:
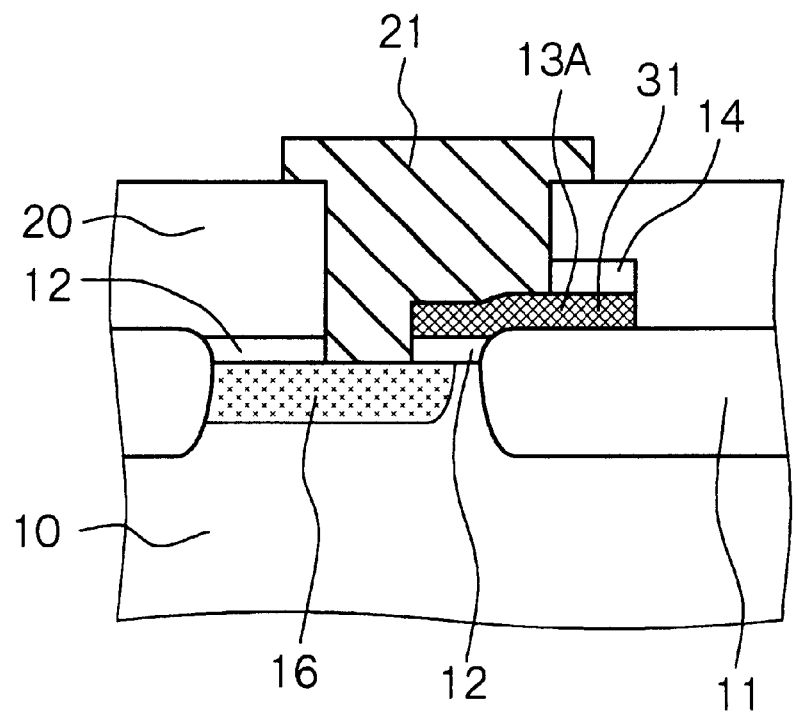
FIGS. 15A and 15B are schematic, partial cross-sectional views of the memory cell in Example 4.
Figure 15B:
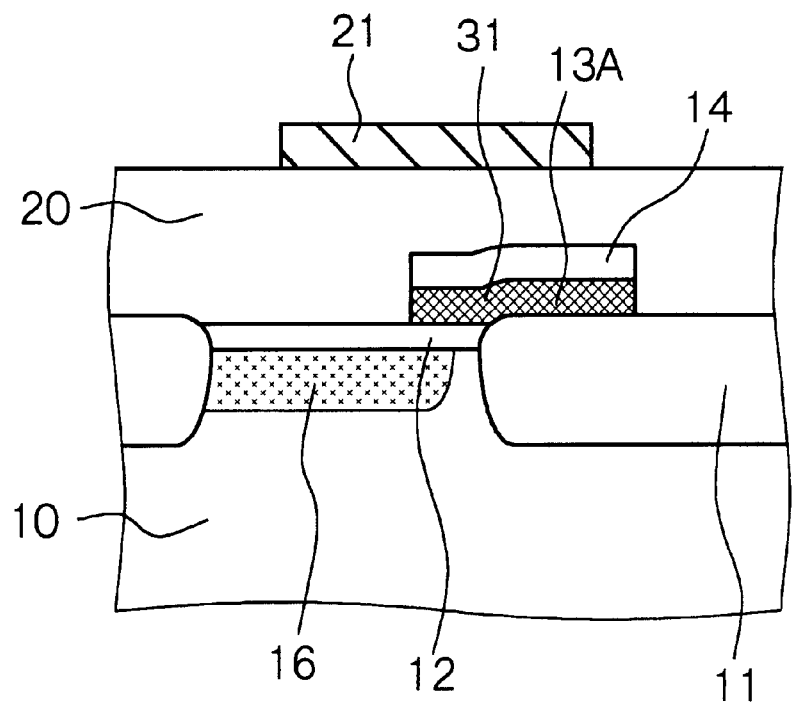

Example 4 is concerned with the memory cell according to the second configuration of the present invention. FIG. 4A shows the principle of the memory cell of Example 4, and FIGS. 4B and 5 show equivalent circuits of the memory cell of Example 5. Further, FIG. 13 shows a schematic layout of first gates 13, a first gate extended region 13A, channel forming regions 15, a drain region 16, source regions 17 and non-linear resistance elements 30 in two adjacent memory cells. Further, FIGS. 14A, 14B and FIGS. 15A and 15B show schematic, partial cross-sectional views. FIG. 14A is a schematic, partial cross-sectional view taken along arrows A—A in FIG. 13. FIG. 14B is a schematic, partial cross-sectional view taken along arrows B—B in FIG. 13. FIG. 15A is a schematic, partial cross-sectional view taken along arrows C—C in FIG. 13 (including a contact hole). FIG. 15B is a schematic, partial cross-sectional view taken along arrows C—C in FIG. 13 (including no contact hole).

The memory cell of Example 4 can have the same constitution as that explained in Example 1 except for a position where the first non-linear resistance element 30 is formed and except that the semiconductor region 31 which is the other end of the first non-linear resistance element 30 and one source/drain region (drain region 16) are connected to the bit line (BL) 21 through a so-called shared contact hole.

That is, the memory cell of Example 4 has the channel forming region 15, the first gate 13, the second gate 19 capacitively coupled with the first gate 13, the source/drain regions (the drain region 16 and the source region 17) formed in contact with the channel forming region 15 and spaced from each other, the first non-linear resistance element 30 with two ends, and a second non-linear resistance element 33. The second non-linear resistance element 33 can have the same constitution as that explained in Example 1. The first gate 13 is formed on the insulation layer 12 (so-called gate insulation layer), and the first gate 13 and the channel forming region face each other through the insulation layer 12. The second gate 19 is capacitively coupled with the first gate 13 through the dielectric film 18. The second gate 19 is connected to the word line WL. Specifically, the second gate 19 has a common region with the word line WL.

In Example 4, the first non-linear resistance element 30 also has characteristics explained in Example 1, and more specifically, it comprises a pn junction diode having a lateral pn junction. Part of the first the first non-linear resistance element 30 comprising the pn junction diode is formed in a first gate extended region 13A on the insulation layer 12 formed on one source/drain region (the drain region 16 in Example 4). Further, the rest of the first non-linear resistance element 30 is also formed in the first gate extended region 13A on an insulation region (device separation region 11).

That is, the pn junction diode constituting the first non-linear resistance element 30 has a semiconductor region 31 which is the same as the source/drain regions 16 and 17 in conductivity type (for example, n-type) and a semiconductor region (the first gate extended region 13A) which is opposite to the source/drain regions 16 and 17 in conductivity type (for example, p-type). The first gate extended region 13A corresponds to one end of the first non-linear resistance element 30, and the semiconductor region 31 corresponds to the other end of the first non-linear resistance element 30. Further, a lateral pn junction is formed in a boundary region between the first gate extended region 13A and the semiconductor region 31. The semiconductor region 31 (for example, n-type in conductivity type), which corresponds to the other end of the first non-linear resistance element 30, and one source/drain region (the drain region 16 in Example 4) are connected to the bit line (BL) 21 through the shared contact hole.

The process for the manufacture of the memory cell of Example 4 is, in principle, the same as the process explained in Example 1 or 2, and detailed explanations thereof are therefore omitted.

Figure 16A:
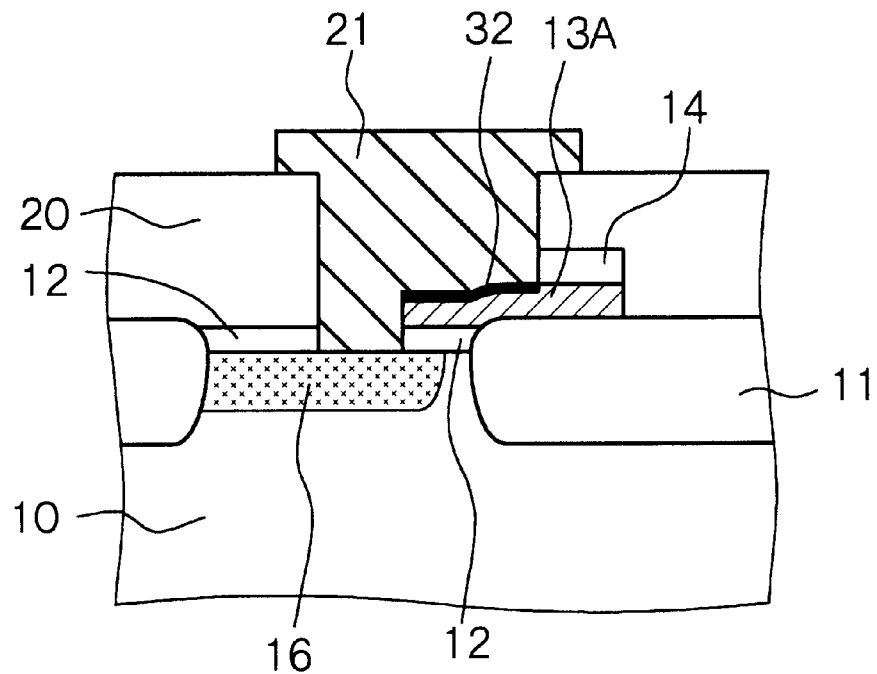
FIGS. 16A and 16B are schematic, partial cross-sectional views of variant of the memory cell in Example 4.
Figure 16B:
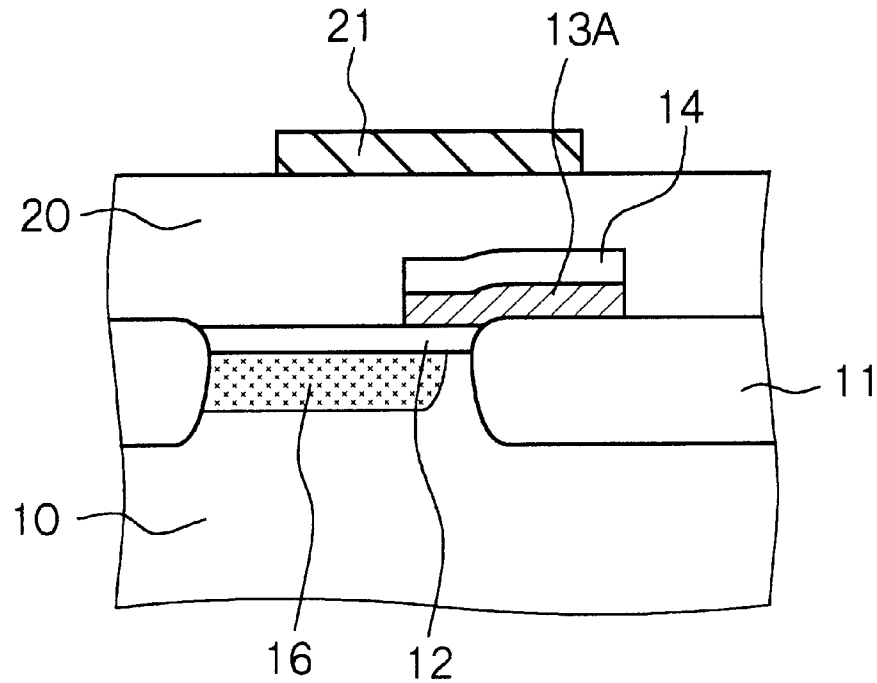
Figure 17:
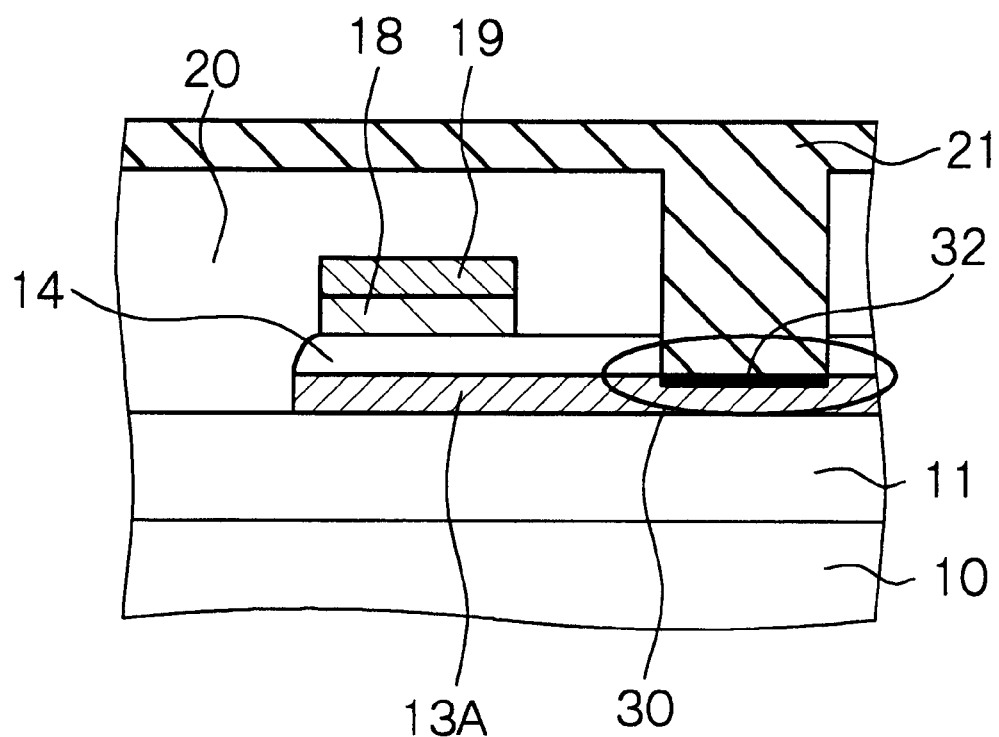
FIG. 17 is a schematic, partial cross-sectional view of variant of the memory cell in Example 4.

Alternatively, as FIGS. 16A and 16B show schematic, partial cross-sectional views, the first non-linear resistance element 30 may be formed of a hetero-junction diode, for example, by forming a silicide layer 32 on the surface region of part of the first gate extended region 13A positioned in the bottom portion of the shared contact hole. The schematic, partial cross-sectional views of the memory cell shown in FIGS. 16A and 16B are similar to the schematic, partial cross-sectional views of the memory cell shown in FIGS. 15A and 15B. The schematic, partial cross-sectional view of the memory cell shown in FIG. 17 is similar to the schematic, partial cross-sectional view of the memory cell shown in FIG. 14B.

EXAMPLE 5

Figure 18A:
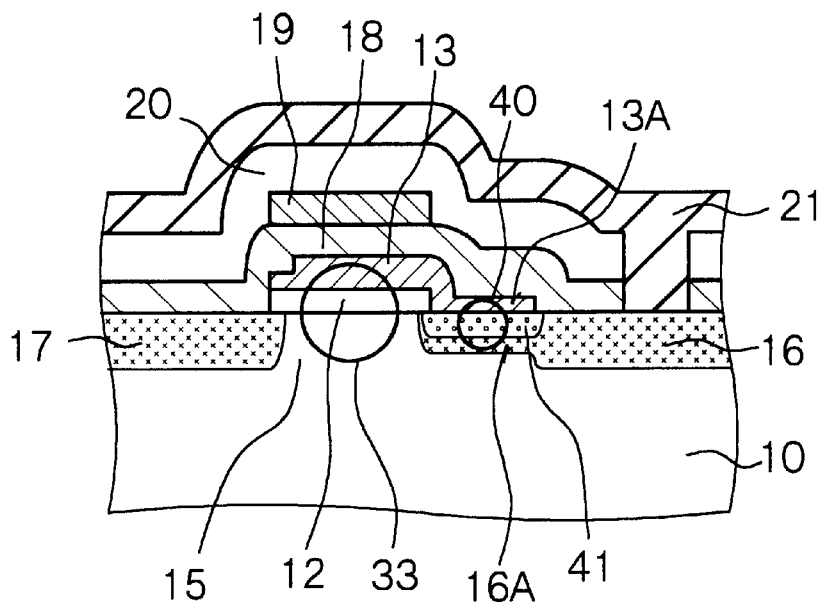
FIGS. 18A and 18B are schematic, partial cross-sectional views of memory cells in Example 5 and its variant.

Example 5 is concerned with the memory cell according to the third configuration of the present invention. FIG. 18A shows a schematic, partial cross-sectional view of the memory cell of Example 5, and FIGS. 6A and 6B show a fundamental, principle drawing and an equivalent circuit thereof, respectively. The memory cell of Example 5 has a channel forming region 15, a first gate 13, a second gate 19 capacitively coupled with the first gate 13, source/drain regions 16 and 17 (drain region 16 and source region 17) formed in contact with the channel forming region 15 and spaced from each other, a first non-linear resistance element 40 with two ends, and a second non-linear resistance element 33. In Example 5, one end of the first non-linear resistance element 40 is connected to the first gate 13, and the other end of the first non-linear resistance element 40 is connected to one source/drain region (the drain region 16). The first gate 13 is formed on the insulation layer 12 (so called gate insulation layer) having a thickness of 3 to 1.5 nm, and the first gate 13 and the channel forming region 15 face each other through the insulation layer 12. The second non-linear resistance element 33 comprises the first gate 13, the insulation layer 12 and the channel forming region 15. The second gate 19 is capacitively coupled with the first gate 13 through a dielectric film 18. The second gate 19 is connected to a word line WL. Specifically, the second gate 19 has a common region with the word line WL. One source/drain region (the drain region 16) is connected to a bit line (BL) 21.

The memory cell of Example 5 also has characteristics that the first non-linear resistance element 40 is brought into a low resistive state when a predetermined voltage is applied. That is, the first non-linear resistance element 40 has the same characteristics as those explained in Example 1, and more specifically, it comprises a pn junction diode. The pn junction diode has two regions. One region of the pn junction diode has a conductivity type (for example, p-type) opposite to the conductivity type (for example, n-type) of the source/drain regions 16 and 17. This region of the pn junction diode is referred to as "opposite conductivity-type region 41", and corresponds to one end of the first non-linear resistance element 40. The opposite conductivity-type region 41 is formed in the surface region of one source/drain region (the drain region 16). The other region of the pn junction has the same conductivity type (for example, n-type) as the conductivity type of the source/drain regions 16 and 17, corresponds to the other end of the first non-linear resistance element 40, and has a common region with said one source/drain region (the drain region 16). That is, in the surface of a region 16A having a relatively low dopant (impurity) concentration in the drain region 16, there is formed the region (opposite conductivity-type region) 41 having a conductivity type (for example, n-type) opposite to the conductivity type (for example, p-type) of the above drain region 16. A first gate extended region 13A is in contact with the surface of the opposite conductivity-type region 41.

The process for the manufacture of the memory cell of Example 6 shown in FIG. 18A will be explained with reference to FIGS. 19A, 19B and 19C which schematically show a semiconductor substrate and the like.

[Step-500]

First, a device separation region (not shown) having a LOCOS structure or a trench structure is formed in a semiconductor substrate 10 by a known method. Then, the semiconductor substrate 10 is ion-implanted with a p-type dopant for forming the channel forming region 15. Then, the surface of the semiconductor substrate 10 is treated by a thermal oxidation method or a method in which thermal nitriding is carried out after thermal oxidation, to form the insulation layer 12 having a thickness of 3 to 1.5 nm and corresponding to a gate insulation layer on the semiconductor substrate 10. Then, a first polysilicon layer doped, for example, with a p-type dopant is deposited on the entire surface by a CVD method, and the first polysilicon layer and the insulation layer 12 are patterned so as to retain the first polysilicon layer to form part of the first gate 13. Then, the semiconductor substrate 10 is ion-implanted, for example, with an n-type dopant, to form the region 16A having a relatively low dopant concentration in the exposed semiconductor substrate 10. Then, a second polysilicon layer doped, for example, with a p-type dopant is deposited on the entire surface by a CVD method, and the second polysilicon layer is patterned, whereby the first gate 13 and the first gate extended region 13A can be formed. The above second polysilicon layer is required to have a thickness which is sufficiently small for an impurity ion reaching the surface of the semiconductor substrate 10 at an n-type dopant ion-implanting step to be carried out thereafter. Figures show the first gate 13 as one layer, while it comprises these two polysilicon layers. In this manner, the first gate 13 can be formed on the insulation layer 12, and the extended region 13A extending from the first gate 13 to a region to form one source/drain region (a region to form a drain region) can be formed on the semiconductor substrate 10. The above extended portion 13A extends from the first gate 13 to a region for forming the opposite conductivity type impurity region 41. The channel forming region 15 is formed below the first gate 13. Further, the second non-linear resistance element 33 comprising the first gate, the insulation layer 12 and the channel forming region 15 can be produced.

[Step-510]

Figure 19A:
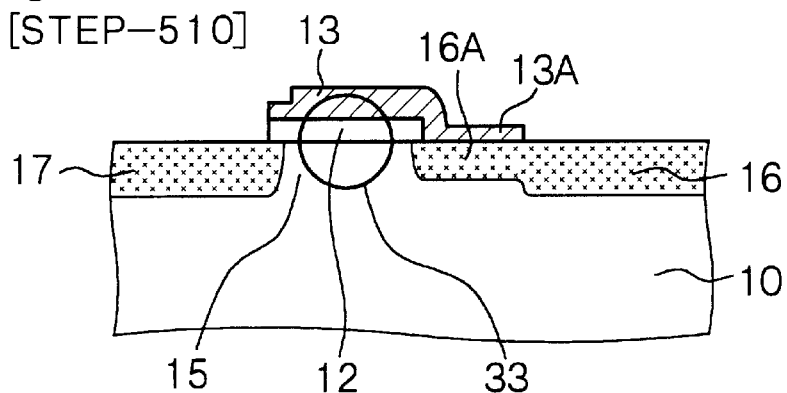
FIGS. 19A, 19B and 19C are schematic, partial cross-sectional views of a semiconductor substrate, etc., for explaining the process for the manufacture of the memory cell in Example 5.
Figure 19B:
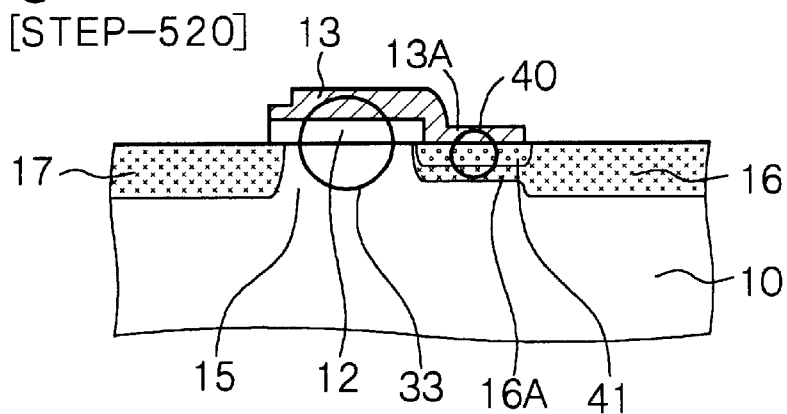
Figure 19C:
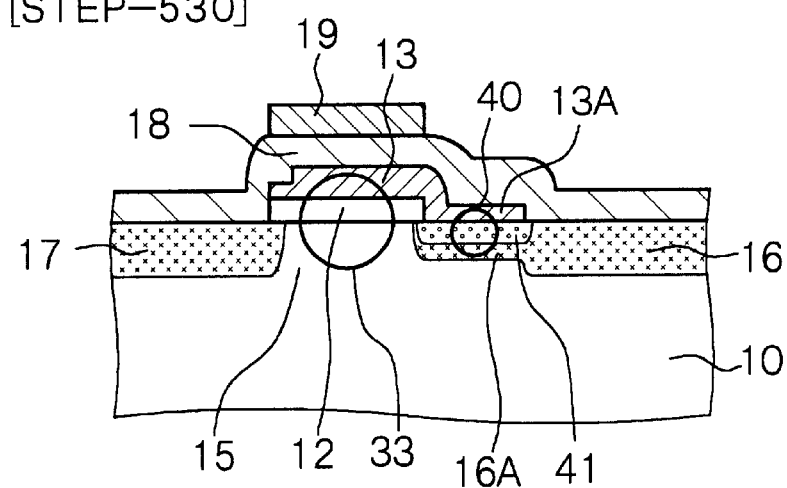

Then, the semiconductor substrate 10 is ion-implanted with an n-type dopant, to form the drain region 16 and the source region 17 (see FIG. 19A).

[Step-520]

Then, the first non-linear resistance element 40 comprising a pn junction diode is formed. For this purpose, for example, the dopant (impurity) from the second polysilicon layer constituting the first gate extended region 13A is diffused to the surface region of the drain region 16 below the first gate extended region 13A, or the surface region of the drain region 16 is ion-implanted with a p-type dopant, whereby the opposite conductivity-type impurity region 41 is formed (see FIG. 19B). Then, the dopant (impurity) is annealed for activation. [Step-510] and [Step-520] may be reversed in order. In some cases, the formation of the opposite conductivity-type impurity region 41 or the formation of the drain region 16 and the source region 17 may be carried out before the formation of the first gate 13 and the first gate extended region 13A.

[Step-530]

Then, an insulation interlayer, which works as the dielectric film 18 and is composed of, for example, $SiO_2$, $SiO_2/Si_xN_y$, $SiO_2/Si_xN_y/SiO_2$ or $Ta_2O_5/Si_xN_y$, is formed on the entire surface by a CVD method, a thermal oxidation method, a thermal nitriding method or a plasma nitriding method. Then, a polysilicon layer doped, for example, with an n-type dopant is deposited on the entire surface by a CVD method, and then the polysilicon layer is patterned, whereby the second gate 19 is formed (see FIG. 19C). The second gate 19 has a common region with the word line WL.

[Step-540]

Then, an insulation interlayer 20 formed, for example, of $SiO_2$ is deposited on the entire surface by a CVD method, and then an opening portion is formed in the insulation interlayer 20 above the drain region 16. Then, a wiring layer of, for example, an aluminum alloy is deposited on the insulation interlayer 20 and in the above opening portion by a sputtering method, and the wiring layer is patterned, thereby to form the bit line (BL) 21 electrically connected to the drain region 16. In this manner, the memory cell having a constitution shown in FIG. 18A can be obtained.

EXAMPLE 6

Figure 20A:
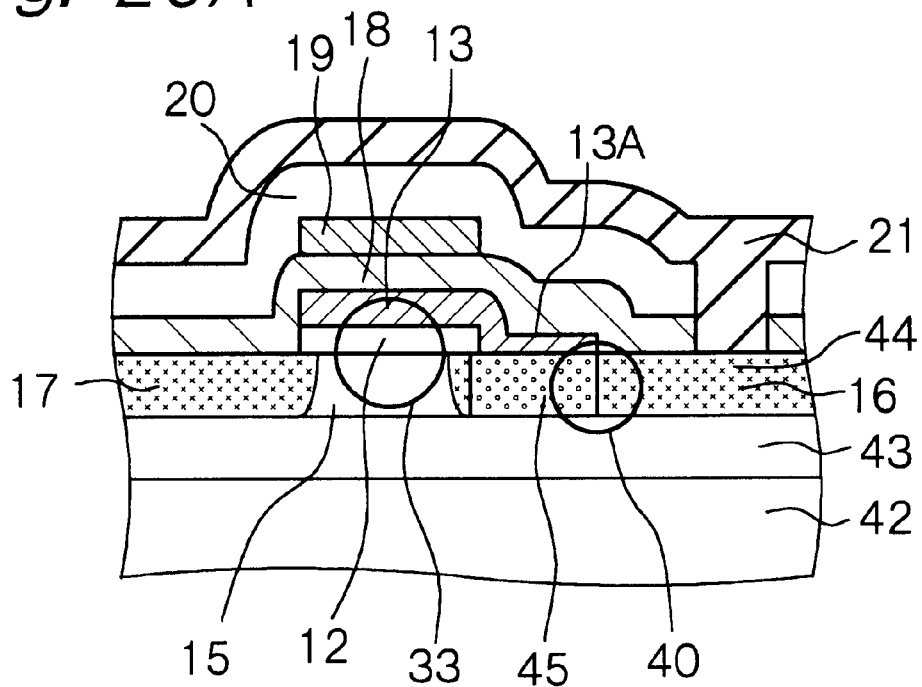
FIG. 20A is a schematic, partial cross sectional view of the memory cell in Example 6
Figure 20B:
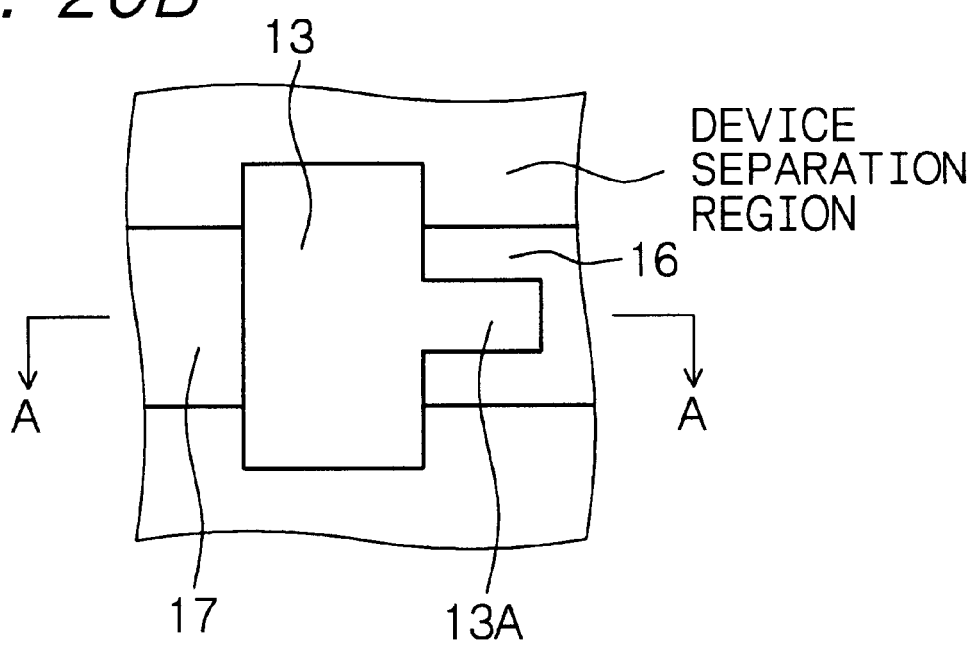
FIG. 20B is a schematic layout of a first gate, etc., of the memory cell.

The memory cell of Example 6 is a variant of the memory cell of Example 5. As shown in the schematic, partial cross-sectional view of FIG. 20A, the memory cell of Example 6 differs from the memory cell of Example 5 in that the memory cell has a so-called SOI structure and that a first non-linear resistance element 40 comprises an opposite conductivity-type impurity region 45 (containing, for example, a p-type dopant) formed all through the entire thickness direction of a silicon layer 44 and a drain region 16 (containing, for example, an n-type dopant). The pn junction diode has two regions. One region of the pn junction diode is an opposite conductivity-type impurity region 45 which has a conductivity type (for example, p-type) opposite to the conductivity type (for example, n-type) of the source/drain regions 16 and 17 and is formed in part of one source/drain region (the drain region 16). The opposite conductivity-type impurity region 45 corresponds to one end of the first non-linear resistance element 40. The other region of the pn junction diode corresponds to the other end of the first non-linear resistance element 40 and has a common region with one source/drain region (the drain region 16 in Example 6). The pn junction diode constituting the first non-linear resistance element 40 has a lateral pn junction and is formed in a silicon layer 44 which is a single crystal semiconductor region. FIG. 20B shows a schematic layout of the first gate 13, the first gate extended region 13A, the drain region 16 and the source region 17. FIG. 20A shows a schematic, partial cross sectional view taken along arrows A—A in FIG. 20B. The opposite conductivity-type impurity region 45 is formed below the first gate extended region 13A, and is formed only in part of the drain region 16 in a width direction. When the first non-linear resistance element 40 has the above constitution, a pn junction area can be decreased, and the value of $I_{R1}$ can be decreased. As a result, information stored on or in the first gate 13 can be read out for a longer period of time.

Figure 21A:
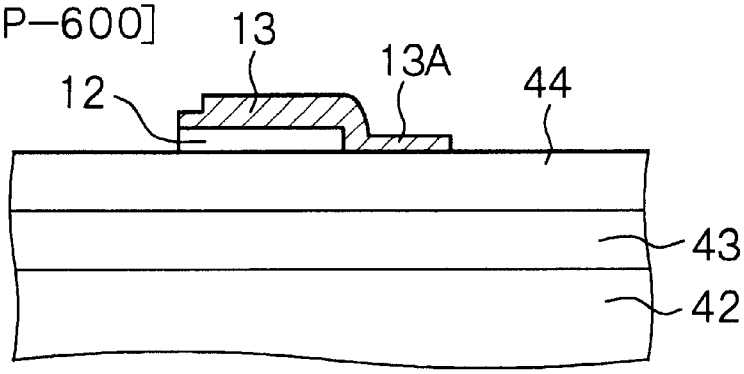
FIGS. 21A, 21B and 21C are schematic, partial cross sectional views of a semiconductor substrate, etc., for explaining the process for the manufacture of the memory cell in Example 6.

The process for the manufacture of the memory cell of Example 6 shown in FIG. 20 will be explained with reference to FIGS. 21A, 21B and 21C which show a schematic, partial cross-sectional view of a semiconductor substrate and the like.

[Step-600]

First, a single crystal thin-film silicon layer 44 is formed on a supporting substrate 42 such as a silicon semiconductor substrate through an insulating layer 43 formed, for example, of $SiO_2$ by a so-called bonding method in which substrates are bonded, ground and polished, by an SIMOX method, or by a lateral solid phase epitaxy method. Then, the silicon layer 44 is subjected to selective oxidation treatment to form a so-called field oxide film (insulation region) with retaining a region where memory cells with a stored charge on gates are to be formed. Then, the surface of the silicon layer 44 is treated by a thermal oxidation method or a method in which thermal nitriding is carried out after thermal oxidation, to form an insulation layer 12 having a thickness of 3 to 1.5 nm and corresponding to a gate insulation layer on the surface of the silicon layer 44. Then, a first polysilicon layer doped, for example, with a p-type dopant is deposited on the entire surface by a CVD method, and then the first polysilicon layer and the insulation layer 12 are patterned so as to leave the first polysilicon layer which is to form part of the first gate 13. Then, a second polysilicon layer doped, for example, with a p-type dopant is again deposited on the entire surface by a CVD method, and the second polysilicon layer is patterned, whereby the first gate 13 and the first gate extended region 13A can be formed. The above second polysilicon layer is required to have a thickness sufficiently small for a dopant reaching the silicon layer 44 in an n-type dopant implanting step to be carried out thereafter. In the Figures, the first gate 13 is shown as one layer, while it comprises the above two polysilicon layers. In this manner, the first gate 13 is formed on the insulation layer 12, and the first gate extended region 13A extending from the first gate 13 to a region where one of the source/drain regions is to be formed in the silicon layer 44 can be formed on the silicon layer 44 (see FIG. 21A). The first gate extended region 13A extends from the first gate 13 to a region where the opposite conductivity-type impurity region 45 is to be formed in the silicon layer 44. The first gate extended region 13A preferably has a plane shape as shown in FIG. 20B, while the plane shape of the first gate extended region 13A shall not be limited thereto.

[Step-610]

Figure 21B:
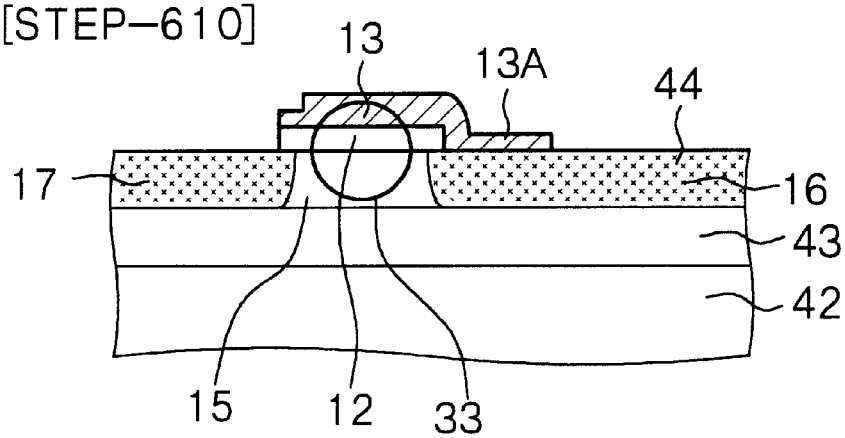
Figure 21C:
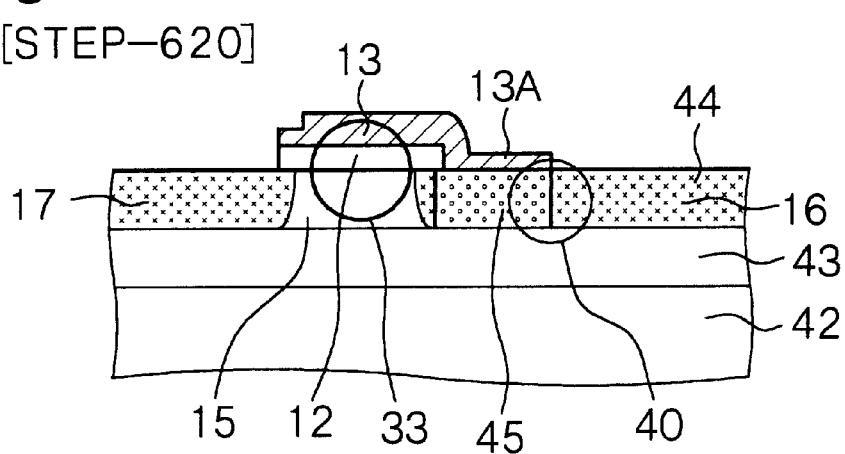

Then, the silicon layer 44 is ion-implanted with, for example, an n-type dopant, to form the drain region 16 and the source region 17 (see FIG. 21B). Further, the second non-linear resistance element 33 comprising the first gate 13, the insulation layer 12 and the channel forming region 15 can be produced.

[Step-620]

The silicon layer 44 below the first gate extended region 13A is ion-implanted with, for example, a p-type dopant all through the thickness direction of the silicon layer 44 to form the opposite conductivity-type impurity region 45, for forming the first non-linear resistance element 40 comprising a pn junction diode (see FIG. 21C). Then, the implanted dopant (impurity) is annealed for activation. [Step-610] and [Step-620] may be reversed in order. In some cases, the opposite conductivity-type impurity region 45 may be formed before the formation of the first gate 13 and the first gate extended region 13A.

[Step-630]

Then, an insulation interlayer which works as the dielectric film 18 and is composed of, for example, $SiO_2$, $SiO_2/Si_xN_y$, $SiO_2/Si_xN_y/SiO_2$ or $Ta_2O_5/Si_xN_y$ is formed on the entire surface by a CVD method, a thermal oxidation method, a thermal nitriding method or a plasma nitriding method. Then, a polysilicon layer doped, for example, with an n-type dopant is deposited on the entire surface by a CVD method, and then the polysilicon layer is patterned, to form the second gate 19. The second gate 19 has a common region with the word line WL.

[Step-640]

Then, an insulation interlayer 20 formed, for example, of $SiO_2$ is deposited on the entire surface by a CVD method, and then an opening portion is formed in the insulation interlayer 20 above the drain region 16. Then, a wiring layer of, for example, an aluminum alloy is deposited on the insulation interlayer 20 and in the above opening portion by a sputtering method, and the wiring layer is patterned, thereby to form the bit line (BL) 21 electrically connected to the drain region 16. In this manner, the memory cell having a constitution shown in FIG. 20 can be obtained.

EXAMPLE 7

Figure 22:
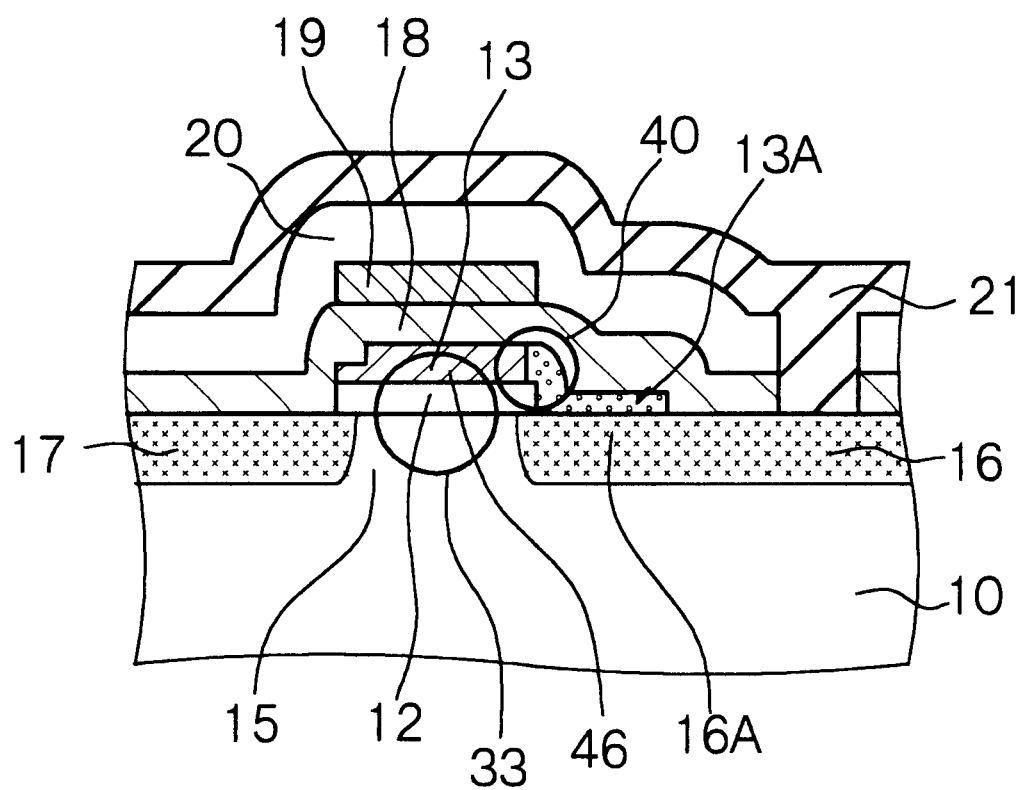
FIG. 22 is a schematic, partial cross-sectional view of the memory cell in Example 7.

The memory cell of Example 7 is also a variant of the memory cell of Example 5. The memory cell of Example 7 differs from the memory cell of Example 5 in the following points. That is, as FIG. 22 shows a schematic, partial cross-sectional view, the first non-linear resistance element 40 comprises a pn junction diode having two regions. One region of the pn junction diode has a conductivity type (for example, p-type) opposite to the conductivity type (for example, n-type) of the source/drain regions 16 and 17, and has a common region with the first gate 13. The above one region of the pn junction diode corresponds to one end of the first non-linear resistance element 40. The other region of the pn junction diode region has a conductivity type (for example, n-type) which is the same as the conductivity type (for example, n-type) of the source/drain regions 16 and 17, and is formed in the first gate extended region 13A extending from the first gate 13 to one source/drain region (the drain region 16). The above other end of the pn junction diode corresponds to the other end of the first non-linear resistance element 40. That is, the pn junction diode comprising the first gate 13 containing, for example, a p-type dopant and the first gate extended region 13A (containing, for example, an n-type dopant) extending from the first gate 13 to the drain region 16. When the first non-linear resistance element 40 has the above constitution, the pn junction area can be decreased and the value of $I_{R1}$ can be decreased as well. As a result, information stored on or in the first gate 13 can be read out for a longer period of time.

The process for the manufacture of the memory cell of Example 7 shown in FIG. 22 will be explained hereinafter.

[Step-700]

First, in the same manner as in [Step-500] of Example 5, a device separation region (not shown) having a LOCOS structure or a trench structure is formed in a semiconductor substrate 10 by a known method. Then, the surface of the semiconductor substrate 10 is treated by a thermal oxidation method or a method in which thermal nitriding is carried out after thermal oxidation, to form an insulation layer 12 having a thickness of 3 to 1.5 nm and corresponding to a gate insulation layer on the semiconductor substrate 10. Then, a first amorphous silicon layer doped, for example, with a p-type dopant is deposited on the entire surface by a CVD method, and then the first amorphous silicon layer and the insulation layer 12 are patterned so as to retain the first amorphous silicon layer which is to form part of the first gate 13. Then, a natural oxide layer and surface contamination are intentionally removed to clean the surface, and then, a second amorphous silicon layer doped, for example, with a p-type dopant is deposited on the entire surface by a CVD method. Then, the amorphous silicon layer is heated approximately up to 700° C. in an inert gas atmosphere. As a result, the second amorphous silicon layer on the semiconductor substrate 10 is converted to a single crystal layer from a portion adjacent to the semiconductor substrate 10 and the single crystal layer laterally grows. Then, the single-crystallized silicon layer is patterned, whereby the first gate 13 and the first gate extended region 13A can be formed. The above second amorphous silicon layer is required to have a thickness which is sufficiently small for impurities reaching the surface region of the semiconductor substrate 10 in an n-type dopant implanting step to be carried out thereafter. In Figures, the first gate 13 is shown as one layer, while it comprises the above two silicon layers. In this manner, the first gate 13 can be formed on the insulation layer 12, and the first gate extended region 13A extending from the first gate 13 to a region where one of the source/drain regions is to be formed in the semiconductor substrate 10 can be formed on the semiconductor substrate 10.

[Step-710]

Then, the semiconductor substrate 10 is ion-implanted with, for example, an n-type dopant, to form the drain region 16 and the source region 17. In this case, the first gate extended region 13A is ion-implanted with the n-type dopant. When part of the first gate 13 is selectively masked with a resist material, the part of the first gate 13 is left as a region containing a p-type dopant and also works as an opposite conductivity-type region 46 of the first non-linear resistance element 40. Further, the second non-linear resistance element 33 comprising the first gate 13, the insulation layer 12 and the channel forming region 15 can be produced.

[Step-720]

Then, the same steps as [Step-530] and [Step-540] of Example 5 are carried out, whereby the memory cell having the structure shown in FIG. 22 can be obtained.

In Example 7, in [Step-700], a pn junction having a lateral pn junction can be formed in the single-crystallized silicon layer. When the pn junction is formed in the single-crystallized silicon layer, the leak current ($I_{R1}$) of the first non-linear resistance element 40 in a non-conductive state can be reliably decreased.

EXAMPLE 8

The memory cell of Example 8 is also a variant of the memory cell of Example 5. The memory cell of Example 8 has substantially the same constitution as that of the memory cell of Example 5, while the process for the manufacture thereof differs from the process in Example 5 to some extent. In particular, the process for the manufacture of the memory cell of Example 8 serves to decrease the cell area. The process for the manufacture of the memory cell of Example 10 will be explained with reference to FIGS. 23A, 23B, 23C, 24A, 24B, 25A, 25B and 26 hereinafter.

[Step-800]

First, a device separation region (not shown) having a LOCOS structure or a trench structure is formed in a semiconductor substrate 10 by a known method. A well (not shown) may be formed in the surface of the semiconductor substrate 10 as required. Then, the surface of the semiconductor substrate 10 is treated by a thermal oxidation method or a method in which thermal nitriding is carried out after thermal oxidation, to form the insulation layer 12 having a thickness of 3 to 1.5 nm and corresponding to a gate insulation layer on the semiconductor substrate 10. Then, a first polysilicon layer 113A doped, for example, with a p-type dopant is deposited on the entire surface by a CVD method, and then the first polysilicon layer 113A and the insulation layer 12 are patterned by a lithographic technique and a dry etching technique so as to retain the first polysilicon layer which is at least to form part of the first gate 13 and part of the first gate extended region 13A (see FIG. 23A).

[Step-810]

Figure 23A:
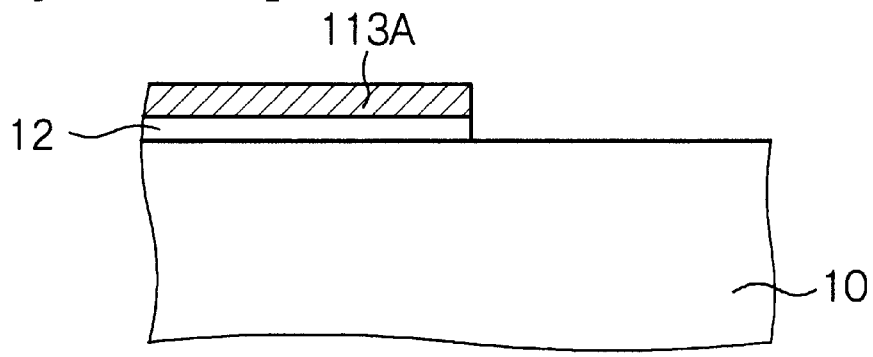
FIGS. 23A, 23B and 23C are schematic, partial cross-sectional views of a semiconductor substrate, etc., for explaining the process for the manufacture of the memory cell in Example 8.
Figure 23B:
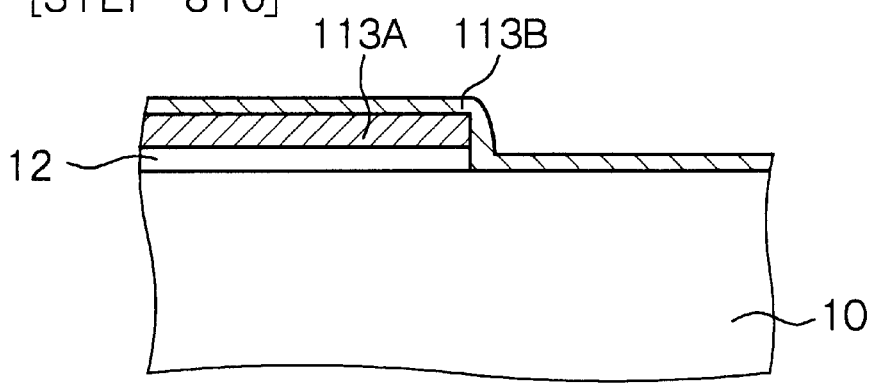

Then, a second polysilicon layer 113B doped, for example, with a p-type dopant is deposited on the entire surface by a CVD method (see FIG. 23B). Preferably, the second polysilicon layer 113B has a smaller thickness than the first polysilicon layer 113A in view of a process margin.

Figure 23C:
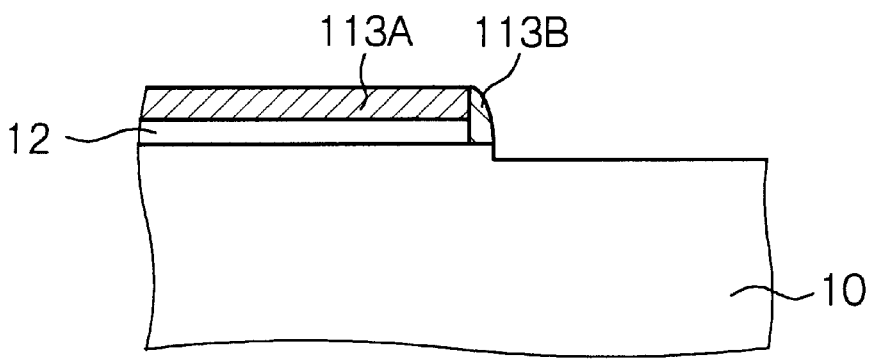
Figure 24A:
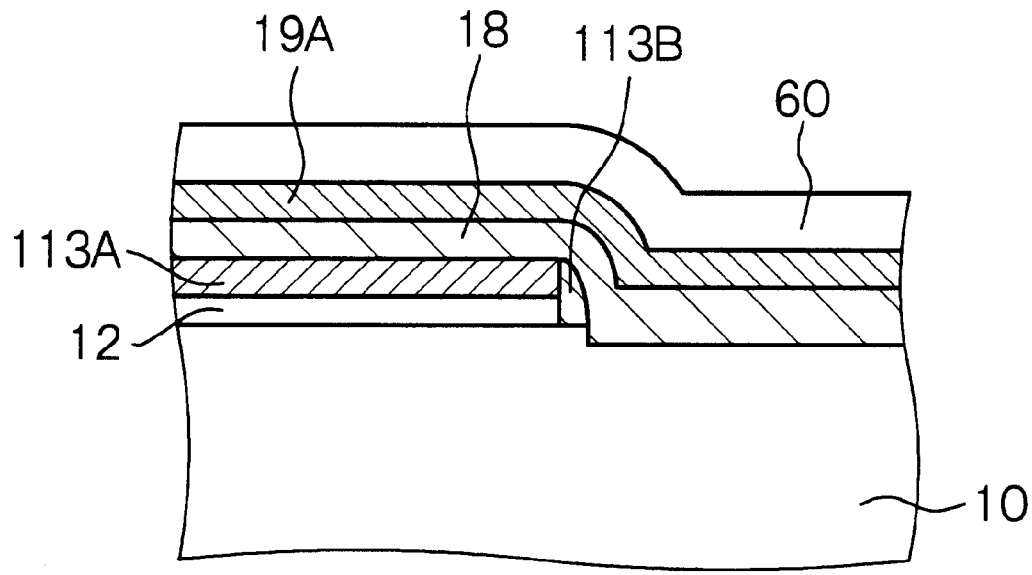
FIGS. 24A and 24B, following
Figure 24B:
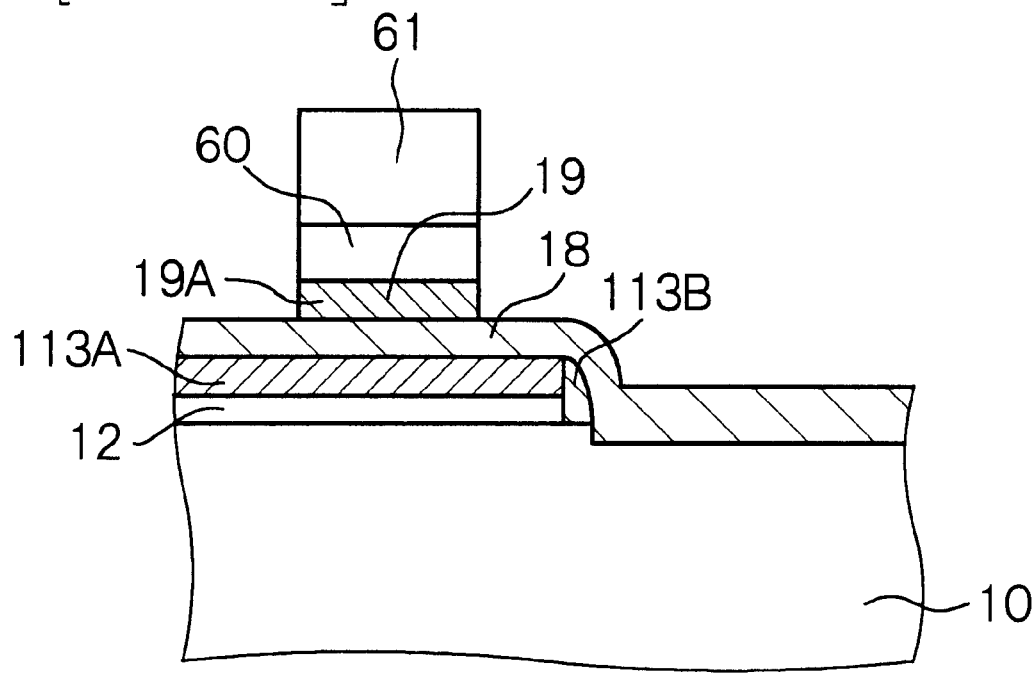
Figure 25A:
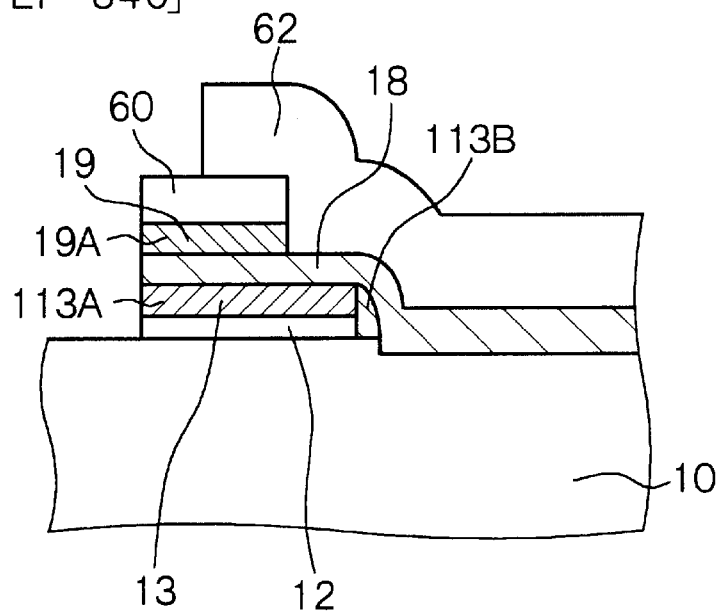
FIGS. 25A and 25B, following
Figure 25B:
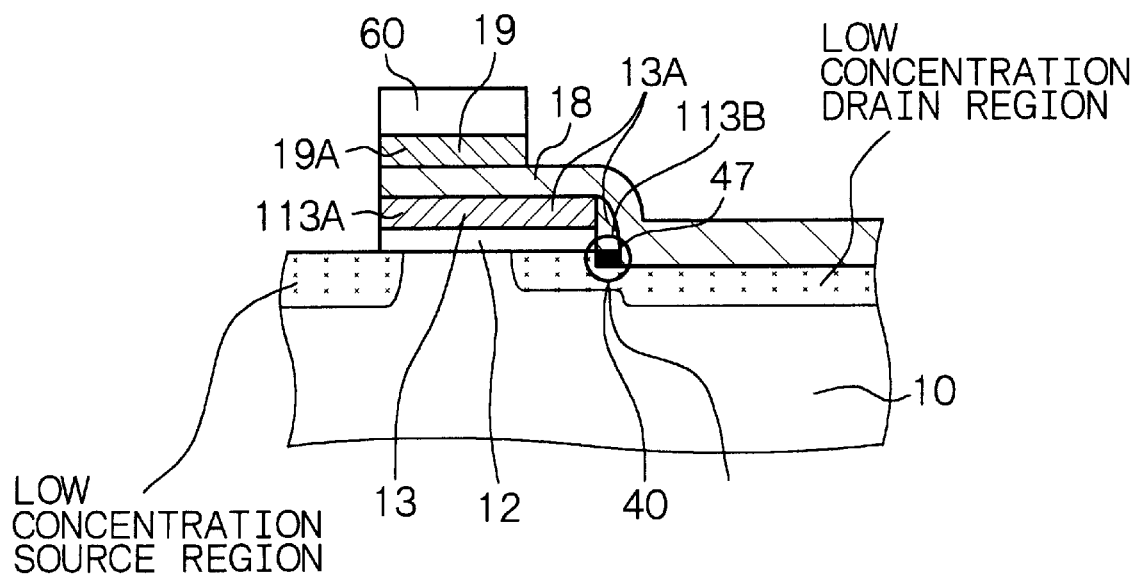
Figure 26:
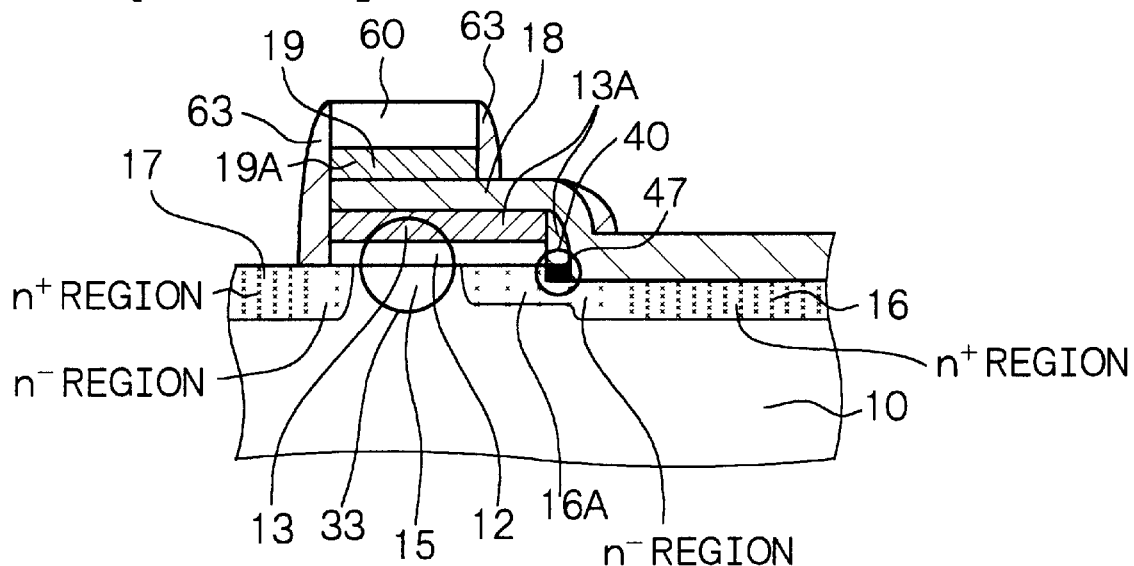
FIG. 26, following

Then, the second polysilicon layer 113B and the first polysilicon layer 113A are uniformly etched by a thickness which is greater than the thickness of the second polysilicon layer 113B but is smaller than the total thickness of the first polysilicon layer 113A and the second polysilicon layer 113B, whereby the first polysilicon layer 113A is retained and the second polysilicon layer 113B is retained on a side wall portion of the first polysilicon layer 113A and the insulation layer 12 (see FIG. 23C). Part of the retained first polysilicon layer 113A corresponds to the first gate 13 and the first gate extended region 13A, and the retained second polysilicon layer 113B corresponds to the first gate extended region 13A. In this step, the first gate extended region 13A is single-crystallized by carrying out [Step-700] of Example 7. As a result, a pn junction can be formed in the single-crystallized silicon layer, and the leak current ($I_{R1}$) of the first non-linear resistance element 30 in a non-conductive state can be reliably decreased.

[Step-820]

Then, the dielectric film 18 composed, for example, of $SiO_2$, $SiO_2/Si_xN_y$, $SiO_2/Si_xN_y/SiO_2$ or $Ta_2O_5/Si_xN_y$ is formed on the entire surface by a CVD method, a thermal oxidation method, a thermal nitriding method or a plasma nitriding method. Then, a third polysilicon layer 19A doped, for example, with an n-type dopant, or a stacked structure of a polysilicon layer and a tungsten silicide layer, is formed on the entire surface, to form a second gate. Further, an oxide film 60 which works as an etching mask is formed thereon (see FIG. 24A).

[Step-830]

A resist material 61 having the shape of a second gate is formed by a lithographic technique, and the oxide film 60 and the third polysilicon layer 19 are etched with using the resist material 61 as a mask. At a time when the dielectric film 18 is exposed, the etching is terminated (see FIG. 24B), whereby the second gate 19 is formed. The second gate 19 has a common region with the word line WL.

[Step-840]

Then, the resist material 61 is removed, and then a resist material 62 is formed by a lithographic technique. For forming a source region side end portion of the first gate, the dielectric film 18, the first polysilicon layer 113A and the insulation layer 12 are etched with using the oxide layer 60 and the resist material 62 as a mask (see FIG. 25A). The source region side end portion of the first gate is etched in a self-alignment manner due to the presence of the side surface of the oxide layer 60. In this manner, the first gate 13 comprising the first polysilicon layer 113A is formed on the insulation layer 12, and the first gate extended region 13A extending from the first gate 13 to a region where one source/drain region is to be formed in the semiconductor substrate 10 can be also formed on the semiconductor substrate 10. The above first gate extended region 13A extends from the first gate 13 to a region where an opposite conductivity-type region 47 is to be formed, and it comprises the first polysilicon layer 113A and the second polysilicon layer 113B.

[Step-850]

Then, the resist material 62 is removed, the surface is cleaned, and then an n-type dopant is selectively ion-implanted with using the second gate 19 as a mask, to form a low-concentration drain region and a low-concentration source region. The total thickness of the insulation layer 12 and the first polysilicon layer 113A is designed in advance so as to be smaller than the range of the above ion implantation. Then, the p-type dopant contained in the second polysilicon layer 113B is thermally diffused into the surface region of the low-concentration drain region by heat treatment. In this manner, the opposite conductivity-type region 47 (p-type dopant region) to constitute the first non-linear resistance element 40 comprising a pn junction diode is formed in the surface region of the semiconductor substrate 10 (see FIG. 25B).

[Step-860]

Then, a spacer insulating layer 63 is formed by a known LDD process, and implantation with n-type dopant is carried out to form a high-concentration drain region 16 and a high-concentration source region 17 (see FIG. 26), whereby the second non-linear resistance element comprising the first gate 13, the insulation layer 12 and the channel forming region 15 can be produced.

[Step-870]

Then, an insulation interlayer formed, for example, of $SiO_2$ is deposited on the entire surface by a CVD method, and an opening portion is formed in the insulation interlayer above the drain region 16. Then, a wiring layer, for example, of an aluminum alloy is deposited on the insulation interlayer and in the above opening portion by a sputtering method, and the wiring layer is patterned, thereby to form the bit line (BL) electrically connected to the drain region 16, whereby the memory cell can be obtained.

According to the above-explained process for the manufacture of the memory cell of Example 8, the first non-linear resistance element having a small area can be formed without relying upon a resolution in the lithographic technique. If the minimum etching dimension (line width) is F, there can be manufactured a memory cell having an area close to $6F^2$.

Figure 27:
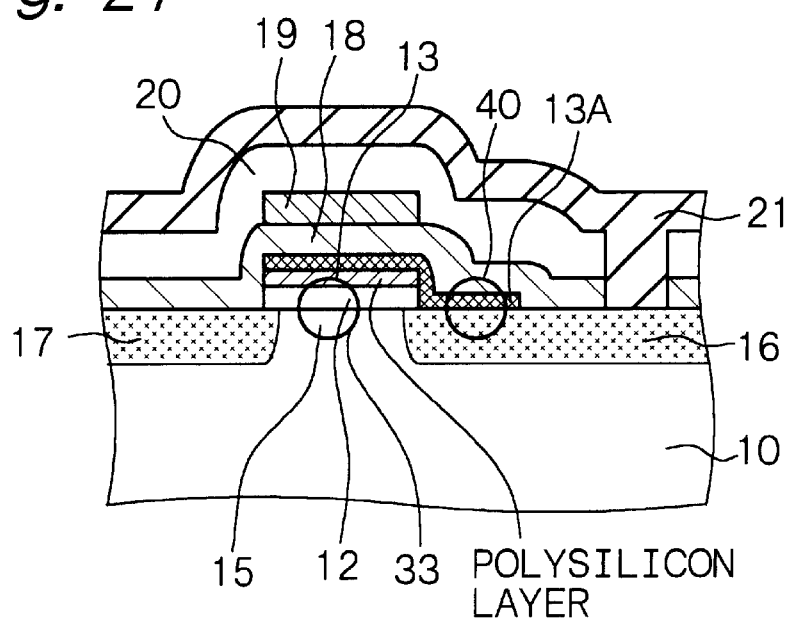
FIG. 27 is a schematic, partial cross sectional view of variant of the memory cell in Example 1.
Figure 28:
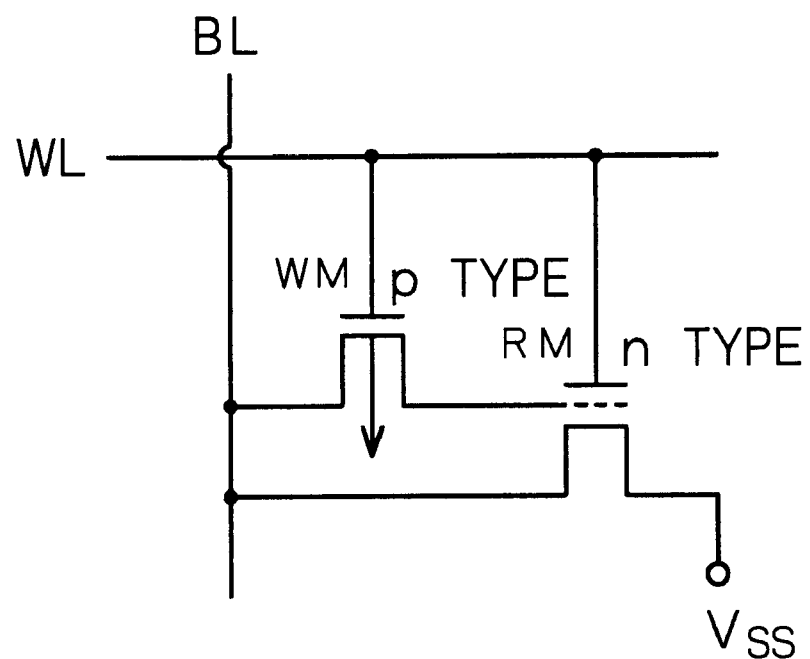
FIG. 28 shows an equivalent circuit of a conventional so-called DRAM gain cell.

The first non-linear resistance element may comprise a hetero-junction diode (for example, Schottky barrier diode) of which the partial cross-sectional view is schematically shown in FIG. 27, in place of the pn junction diode. In this case, for example, in Example 5, a titanium silicide layer can be formed on the surface of the drain region 16 instead of the formation of the second polysilicon layer. In this manner, the hetero-junction diode can be composed of a conductive region (to which the extended region 13A corresponds, and which corresponds to one end of the first non-linear resistance element) formed on the surface region of one source/drain region (the drain region 16) and one source/drain region (which is the drain region 16 and corresponds to the other end of the first non-linear resistance element 30). That is, the first gate 13 may be structured of two layers consisting of a polysilicon layer and a titanium silicide layer, and the first gate extended region 13A from the first gate 13 may be formed of the titanium silicide layer. In this case, the hetero-junction region comprises the drain region 16 and a portion (conductive region) of the first gate extended region 13A which is formed of titanium silicide and is in contact with the drain region 16. The material for forming the hetero-junction diode shall not be limited to titanium silicide, and it can be also selected, for example, from cobalt silicide or tungsten silicide or can be selected from other metal materials such as molybdenum. When the first non-linear resistance element comprises a hetero-junction diode, $F_{F1}$ can be controlled by properly selecting an annealing temperature or a metal for forming a silicide.

Figure 18B:
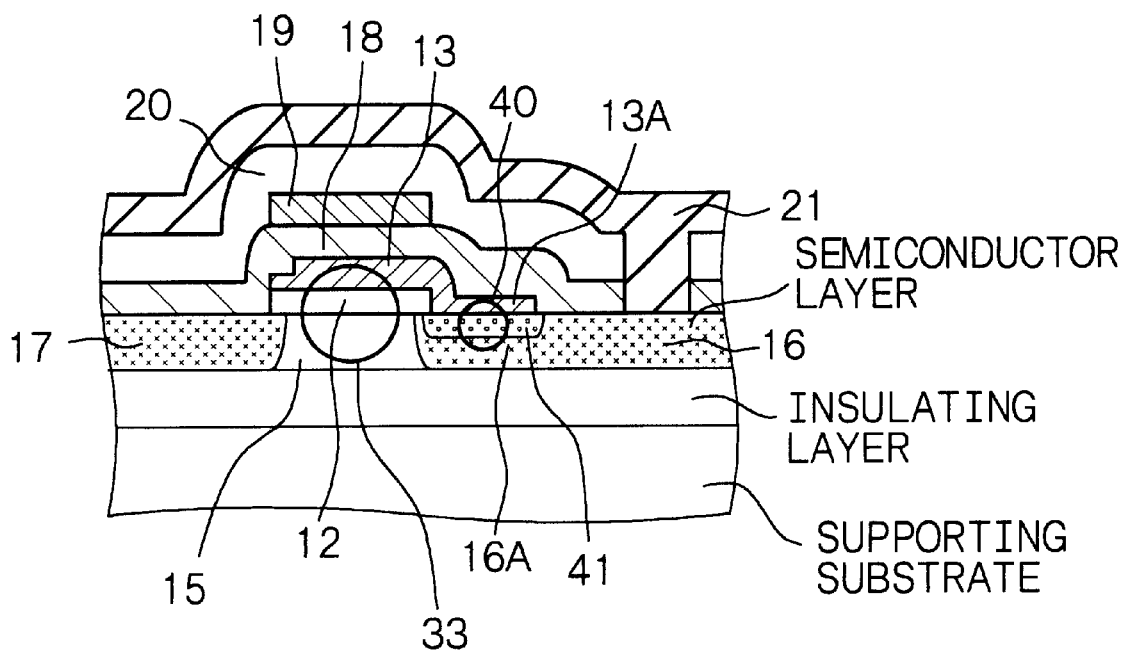

The present invention has been explained with reference to Examples, while the present invention shall not be limited thereto. The memory cell structures are examples, and may be altered in design as required. Further, Examples mainly refer to n-type memory cells as embodiments, while the memory cell of the present invention can naturally apply to a p-type memory cell. In this case, the polarity of each of the first non-linear resistance element 30 and the second non-linear resistance element 33 in the memory cell shown in FIG. 1B, FIG. 4B or FIG. 6B is reversed. In this case, further, the V-I characteristic of the first non-linear resistance element can be prepared by turning the V-I characteristic shown in FIG. 3 180 degrees with the origin as the center. Further, the memory cells explained in Examples 1 to 5, 7 and 8, can be applied to an SOI-structured memory cell. FIG. 18B shows an example of a memory cell obtained by applying the SOI structure to the memory cell explained in Example 5. In some cases, a wiring may be provided for connecting the first gate and one end of the first non-linear resistance element instead of forming the extended region extending from the first gate. The above Examples explain the memory cells on the assumption that one source/drain region is a drain region, while said one source/drain region may be source region. Further, the memory cell provided by the present invention may have a so-called TFT structure. Further, the memory cell can be constituted not only of a silicon semiconductor but also of a compound semiconductor such as GaAs. In the memory cell (n-channel type memory cell) explained in Example 1, 2 or 4, the polarity of the first non-linear resistance element can be reversed by reversing the conduction type of the first gate and the conduction type of the semiconductor region 31. Further, in the memory cell (n-channel type memory cell) explained in Examples 5 to 8, the polarity of the first non-linear resistance element can be reversed by reversing the conduction type of the first gate.

In the memory cell provided by the present invention, a simply structured DRAM gain cell can be obtained, the production process thereof is not so complicated, the memory cell can be produced nearly according to the process for the manufacture of a conventional flash memory, and an increase in the number of external wiring and an increase in the area of terminal portions (contact portions) can be suppressed. Further, unlike a conventional DRAM, no complicatedly structured capacitor is required, and a large capacitor required for a conventional DRAM is, in principle, not required. In the memory cell of the present invention, therefore, the cell area is not much increased. Further, a DRAM-including logic circuit can be easily produced.

Writing and erasing of information on the basis of a tunneling current is well-known, for example, in an electrically re-writable memory cell (EEPROM, Electrically erasable and Programmable ROM). However, the above memory cell has a defect that its information writing rate is low. In the memory cell of the present invention, information can be written at a high rate since the first non-linear resistance element comprising a pn junction diode is provided. Further, since the second non-linear resistance element is provided, the erasing of information can be effected, for example, on all of a plurality of the memory cells.

What is claimed is:

1. A memory cell with a stored charge on its gate comprising;
    (A) a channel forming region,
    (B) a first gate formed on an insulation layer formed on the surface of the channel forming region, the first gate and the channel forming region facing each other through the insulation layer,
    (C) a second gate capacitively coupled with the first gate,
    (D) source/drain regions formed in contact with the channel forming region, one source/drain region being spaced from the other,
    (E) a first non-linear resistance element having two ends, one end being connected to the first gate, said first non-linear resistance element having a non-linear voltage-current characteristic; and (F) a second non-linear resistance element composed of the first gate, the insulation layer and either the channel-forming region and at least one of the source/drain regions.

2. The memory cell according to claim 1, wherein the first non-linear resistance element has a two-terminal operation characteristic.

3. The memory cell according to claim 1, wherein the second gate is capacitively coupled with the first gate through a dielectric film.

4. The memory cell according to claim 1, wherein the insulation layer has a thickness which permits the flow of tunneling current in the insulation layer.

5. The memory cell according to claim 4, wherein the second non-linear resistance element comprises an MIS type or MOS type tunnel diode.

6. The memory cell according to claim 1, wherein the first non-linear resistance element has characteristics that it is brought into a low resistive state when a first voltage having the same polarity as that of a forward conduction voltage and having an absolute value which is equal to, or greater than, an absolute value of the forward conduction voltage is applied across the two ends and that it is brought into a high resistive state when a second voltage having the same polarity as that of the forward conduction voltage and having an absolute value smaller than the absolute value of the forward conduction voltage or a voltage having an opposite polarity to the forward conduction voltage is applied across the two ends.

7. The memory cell according to claim 6, wherein the second gate is connected to a word line, an other end of the first non-linear resistance element opposite said one end is connected to a bit line, one source/drain region is connected to a read line, and the channel forming region or at least one of the source/drain regions which constitutes the second non-linear resistance element is connected to an erase line.

8. The memory cell according to claim 7, wherein an erase-line potential is applied to the erase line to transport a charge having a second polarity opposite to a first polarity from the erase line to the first gate through the second non-linear resistance element, or to discharge the charge having the first polarity from the first gate to the erase line through the second non-linear resistance element, whereby a charge storage state of the first gate is brought into a second charge storage state.

9. The memory cell according to claim 7, wherein the first non-linear resistance element comprises a hetero-junction diode and is formed on the first gate or on an extended region of the first gate.

10. The memory cell according to claim 7, wherein a second bit-line potential is applied to the bit line, a first read-line potential is applied to the read line and then a word-line potential is switched from a first word-line potential to a second word-line potential, thereby to generate the second voltage or a voltage having an opposite polarity to the forward conduction voltage, between the first gate and said other end of the first non-linear resistance element through the capacitive coupling between the first gate and the second gate and to keep the first non-linear resistance element in a high resistive state, whereby the charge stored on the first gate is prevented from undergoing a change in state.

11. The memory cell according to claim 7, wherein a first bit-line potential is applied to the bit line, a first read-line potential is applied to the read line and then a word-line potential is switched from a first word-line potential to a second word-line potential, thereby to generate the first voltage between the first gate and said other end of the first non-linear resistance element through the capacitive coupling between the first gate and the second gate and to bring the first non-linear resistance element into a low resistive state, whereby a charge of a first polarity is transported from the bit line to the first gate through the first non-linear resistance element and the charge of the first polarity is stored on the first gate.

12. The memory cell according to claim 11 or 10, wherein the other source/drain region is reversely biased with regard to the channel forming region when the second word-line potential is applied to the word line.

13. The memory cell according to claim 11 or 10, wherein the other source/drain region is brought into a floating state with regard to the channel forming region when the second word-line potential is applied to the word line.

14. The memory cell according to claim 11, wherein the charge to be stored on the first gate corresponds to stored information and the stored information is information corresponding to a level number of the first bit-line potential.

15. The memory cell according to claim 14, wherein the level number of the first bit-line potential to be applied to the bit line is one and the stored information is binary information.

16. The memory cell according to claim 14, wherein the level number of the first bit-line potential to be applied to the bit line is at least two and the stored information is multi-valued information.

17. The memory cell according to claim 11, wherein the charge to be stored on the first gate corresponds to stored information and the stored information is information corresponding to a level number of the second word-line potential.

18. The memory cell according to claim 17, wherein the level number of the second word-line potential to be applied to the word line is one and the stored information is binary information.

19. The memory cell according to claim 17, wherein the level number of the second word-line potential to be applied to the word line is at least two and the stored information is multi-valued information.

20. The memory cell according to claim 11, wherein the charge to be stored on the first gate corresponds to stored information and the stored information is information corresponding to a level number of the voltage between the second word-line potential and the first bit-line potential.

21. The memory cell according to claim 20, wherein the level number of a voltage between the second word-line potential and the first bit-line potential is one and the stored information is binary information.

22. The memory cell according to claim 20, wherein the level number of the voltage between the second word-line potential and the first bit-line potential is at least two and the stored information is multi-valued information.

23. The memory cell according to claim 7, wherein the first non-linear resistance element comprises a pn junction diode and is formed in the first gate or formed in or on an extended region of the first gate.

24. The memory cell according to claim 23, wherein the pn junction diode has a semiconductor region which is the same as the source/drain regions in conductivity type and a semiconductor region which is opposite to the source/drain regions in conductivity type, the semiconductor region which is opposite to the source/drain regions in conductivity type corresponds to said one end of the first non-linear resistance element, and the semiconductor region which is the same as the source/drain regions in conductivity type corresponds to said other end of the first non-linear resistance element.

25. The memory cell according to claim 23, wherein the pn junction diode has a lateral pn junction.

26. The memory cell according to claim 25, wherein a pn junction region of the pn junction diode is formed of a single crystal semiconductor.

* * * * *